United States Patent
Nakano et al.

(10) Patent No.: US 9,818,945 B2
(45) Date of Patent: Nov. 14, 2017

(54) POLYMER AND SOLAR CELL USING THE SAME

(71) Applicant: KABUSHIKI KAISHA TOSHIBA, Tokyo (JP)

(72) Inventors: Yoshihiko Nakano, Yokohama (JP); Takeshi Gotanda, Yokohama (JP); Shigehiko Mori, Kawasaki (JP); Rumiko Hayase, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 178 days.

(21) Appl. No.: 14/967,675

(22) Filed: Dec. 14, 2015

(65) Prior Publication Data

US 2016/0099414 A1    Apr. 7, 2016

Related U.S. Application Data

(63) Continuation of application No. PCT/JP2014/002939, filed on Jun. 3, 2014.

(30) Foreign Application Priority Data

Jun. 28, 2013 (JP) ................................. 2013-136977

(51) Int. Cl.
*H01L 51/00* (2006.01)
*H01L 51/42* (2006.01)
(Continued)

(52) U.S. Cl.
CPC ........ *H01L 51/0036* (2013.01); *C08G 61/126* (2013.01); *C08G 75/00* (2013.01);
(Continued)

(58) Field of Classification Search
None
See application file for complete search history.

(56) References Cited

U.S. PATENT DOCUMENTS

2010/0099840 A1    4/2010    Moon et al.
2011/0017956 A1    1/2011    Hou et al.
(Continued)

FOREIGN PATENT DOCUMENTS

CN    103159941    6/2013
JP    2001-527102 A    12/2001
(Continued)

OTHER PUBLICATIONS

Seul-Ong Kim et al.; N-Octyl-2,7-dithia-5-azacyclopenta[a]pentalene-4,6-dione-Based Low Band Gap Polymers for Efficient Solar Cells Macromolecules vol. 46, No. 10; May 28, 2013; pp. 3861-3869.
(Continued)

*Primary Examiner* — Catherine S Branch
(74) *Attorney, Agent, or Firm* — Oblon, McClelland, Maier & Neustadt, L.L.P.

(57) ABSTRACT

In one embodiment, a polymer includes a repeating unit represented by a formula (1) shown below. A weight-average
(Continued)

molecular weight of the polymer is in a range of 3000 or more to 1000000 or less.

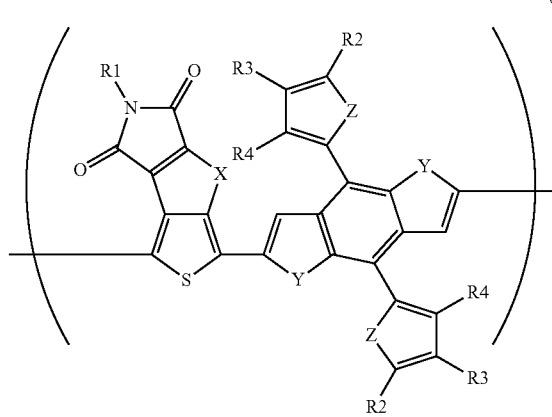

(1)

R1 indicates a monovalent group selected from hydrogen, a substituted or unsubstituted alkyl group, a substituted or unsubstituted aromatic group, and a substituted or unsubstituted hetero-aromatic group. R2, R3, and R4 indicate independently a monovalent group selected from hydrogen, halogen, a substituted or unsubstituted alkyl group, a substituted or unsubstituted alkoxy group, a substituted or unsubstituted aromatic group, and a substituted or unsubstituted hetero-aromatic group. X, Y, and Z indicate independently an atom selected from O, S, and Se.

13 Claims, 1 Drawing Sheet

(51) Int. Cl.
C08G 75/00 (2006.01)
C08G 61/12 (2006.01)
(52) U.S. Cl.
CPC ...... *H01L 51/0043* (2013.01); *H01L 51/4253* (2013.01); *C08G 2261/148* (2013.01); *C08G 2261/149* (2013.01); *C08G 2261/1412* (2013.01); *C08G 2261/1424* (2013.01); *C08G 2261/314* (2013.01); *C08G 2261/3243* (2013.01); *C08G 2261/344* (2013.01); *C08G 2261/91* (2013.01); *H01L 51/0047* (2013.01); *Y02E 10/549* (2013.01)

(56) References Cited

U.S. PATENT DOCUMENTS

| 2011/0124822 A1 | 5/2011 | Yu et al. |
| 2011/0204341 A1 | 8/2011 | Brown et al. |
| 2013/0123449 A1 | 5/2013 | Hou et al. |
| 2014/0005347 A1 | 1/2014 | Yu et al. |
| 2014/0020739 A1 | 1/2014 | Yang et al. |
| 2014/0235817 A1 | 8/2014 | Yu et al. |

FOREIGN PATENT DOCUMENTS

| JP | 2008-231419 A | 10/2008 |
| JP | 2009-267392 A | 11/2009 |
| JP | 2009-283509 A | 12/2009 |
| JP | 2010-527327 | 8/2010 |
| JP | 2011-149012 A | 8/2011 |
| JP | 2011-168747 | 9/2011 |
| JP | 2011-526630 A | 10/2011 |
| JP | 2012-151171 A | 8/2012 |
| JP | 2012-528215 A | 11/2012 |
| JP | 2013-504209 | 2/2013 |
| WO | WO 2010/008672 | 1/2010 |
| WO | WO 2010/013723 A1 | 2/2010 |
| WO | WO 2010/087840 A1 | 8/2010 |
| WO | WO 2010/087840 A9 | 8/2010 |
| WO | WO 2011/011545 | 1/2011 |
| WO | WO 2012/135527 | 10/2012 |
| WO | WO 2013/066065 | 5/2013 |

OTHER PUBLICATIONS

Jianyu Yuan et al.; "Effect of a furan π-bridge on polymer coplanarity and performance in organic field effect transistors" Polymer Chemistry vol. 4, No. 15; Jan. 1, 2013; pp. 4199-4206.

Yang Wang et al.; "Significant Enhancement of Polymer Solar Cell Performance via Side-Chain Engineering and Simple Solvent Treatment" Chemistry of Materials vol. 25, No. 15; Aug. 13, 2013; pp. 3196-3204.

Tae Eui Kang et al.; "Importance of Optimal Composition in Random Terpolymer-Based Polymer Solar Cells" Macromolecules vol. 46, No. 17; Sep. 10, 2013; pp. 6806-6813.

Lijun Huo et al.; "Replacing Alkoxy Groups with Alkylthienyl Groups: A Feasible Approach to Improve the Properties of Photovoltaic Polymers" Angewandte Chemie International Edition, vol. 50, No. 41; Oct. 4, 2011; pp. 9697-9702.

International Search Report dated Aug. 22, 2014, in PCT/JP2014/002939 filed Jun. 3, 2014.

Office Action dated Mar. 1, 2016 in Taiwanese Patent Application No. 103121768 (with English language translation).

Office Action dated May 10, 2016 in Japanese Patent Application No. 2013-136977 (with unedited computer generated English language translation).

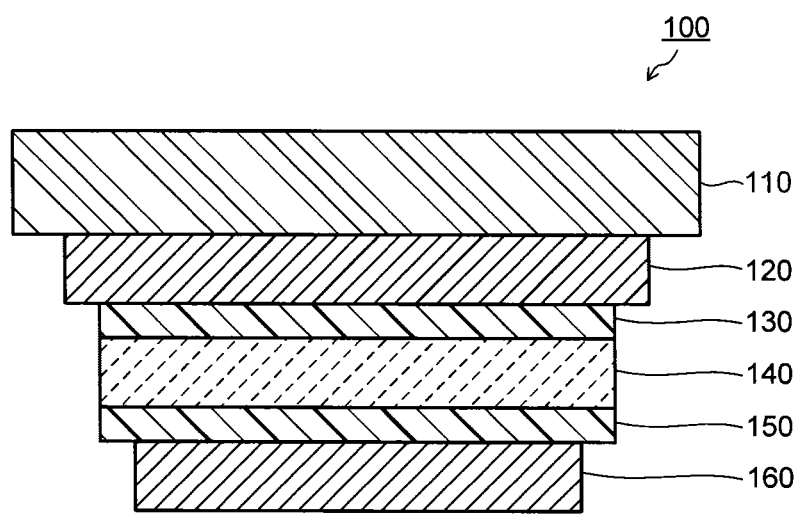

POLYMER AND SOLAR CELL USING THE SAME

CROSS REFERENCE TO RELATED APPLICATION

This application is a continuation of prior International Application No. PCT/JP2014/002939 filed on Jun. 3, 2014, which is based upon and claims the benefit of priority from Japanese Patent Application No. 2013-136977 filed on Jun. 28, 2013; the entire contents of all of which are incorporated herein by reference.

FIELD

Embodiments described herein relate generally to a polymer and a solar cell using the same.

BACKGROUND

An organic semiconductor is expected to be applied to a photoelectric conversion element such as an organic thin film solar cell, a light emitting element, and a photosensor. Especially, a high molecular compound as an organic semiconductor material enables application of a low-cost coating method in fabrication of an active layer. In view of an energy demand and an emission reduction of $CO_2$, a solar cell is expected as one of clean energies with low environmental burdens and its demand is rapidly increasing. A silicon-based solar cell is mainstream at present, but an efficiency thereof is about 15%, and it is difficult to curtail a cost. A CdTe solar cell is also known as a solar cell which can be fabricated at a low cost. However, since Cd being a toxic element is used, there is a possibility that an environmental problem occurs. Under the circumstances, development of an organic thin film solar cell is increasingly expected as a next-generation solar cell which is low in cost, high in energy conversion efficiency, and nontoxic.

In order to put an organic thin film solar cell to practical use, improvement of a power generation efficiency is intensely demanded. The organic thin film solar cells using organic semiconductors made of a variety of high modular compounds are studied. For example, as a polymer exhibiting a conversion efficiency as high as 7% or more, which is at top level in the world, when applied to an organic thin film solar cell, there is known poly(4,8-bis(2-ethylhexyloxy)benzo[1,2-b:4,5-b']dithiophene-2,6-diyl-alt-4-(2-ethylhexyloxycarbonyl)-5-fluoro-thieno[3,4-b]thiophene-2,6-diyl) (abbreviated form: PTB-7). Further, there is also known a polymer (abbreviated form: PBDTTT-CF) made by substituting a carbonyl group (n-heptylcarbonyl group) which is strong in electron attracting for an ester substituent (2-ethylhexyloxycarbonyl group) at 4-position of a thieno[3,4-b]thiophene ring of PTB-7, in order to improve an open circuit voltage (Voc) of an organic thin film solar cell.

In a synthetic process of the aforementioned polymers (PTB-7 and PBDTTT-CF), synthetic pathways of monomers are multi-stepped, and the synthetic process are quite complicated. In order to decrease synthetic stages, there is developed poly{4,8-bis(2-ethylhexyloxy)benzo[1,2-b:4,5-b']dithiophene-2,6-diyl-alt-4-(2-heptylcarbonyl)-thieno[3,4-b]thiophene-2,6-diyl} (abbreviated form: PDBTTT-C) in which hydrogen is substituted for fluorine of 5-position of thieno[3,4-b]thiophene of the PBDTTT-CF. This polymer has a problem that a conversion efficiency is decreased. With regard to the PDBTTT-C, it is known that the conversion efficiency is improved by replacing a 2-ethylhexyloxy group of substituents of 4-position and 8-position of a benzo[1,2-b:4,5-b']dithiophene ring with a 5-(2-ethylhexyl)thienyl group. A conversion efficiency of a solar cell is largely affected also by a side chain of a polymer.

With regard to improvement of a framework structure of a polymer, there is reported a 2,7-dithia-5-azacyclopenta[a]pentalene-4,6-dione based polymer, in which an imide ring is condensed at 4-position and 5-position of the above-described thieno[3,4-b]thiophene. An open circuit voltage (Voc) of an organic thin film solar cell using this polymer is about 0.72 V, and a conversion efficiency stays to be about 5% or less. In order to improve a performance of an organic thin film solar cell using an organic semiconductor, it is necessary to reform a skeletal structure or a side chain of a polymer.

BRIEF DESCRIPTION OF THE DRAWINGS

FIG. 1 is a cross-sectional view showing a configuration of a solar cell of an embodiment.

DETAILED DESCRIPTION

Hereinafter, a polymer of an embodiment and a solar cell using the same will be described.

{Polymer}

The polymer of the embodiment is an organic high molecular compound which includes a repeating unit represented by a formula (1) shown below and whose weight-average molecular weight is in a range of 3000 to 1000000.

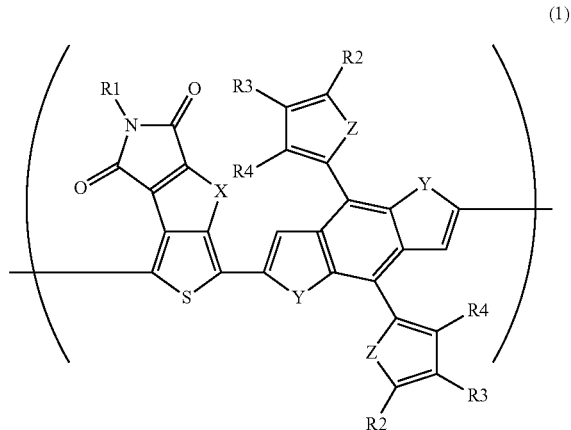

(1)

R1 indicates a monovalent group selected from hydrogen, a substituted or unsubstituted alkyl group, a substituted or unsubstituted aromatic group, and a substituted or unsubstituted hetero-aromatic group. R2, R3, and R4 each independently indicate a monovalent group selected from hydrogen, halogen, a substituted or unsubstituted alkyl group, a substituted or unsubstituted alkoxy group, a substituted or unsubstituted aromatic group, and substituted or unsubstituted hetero-aromatic group. X, Y, and Z each independently indicate an atom selected from O, S, and Se.

In the R1 group, the R2 group, the R3 group, and the R4 group, it is preferable that a carbon number of the substituted or unsubstituted alkyl group is in a range of 1 to 30. The substituted or unsubstituted alkyl group can be any one of straight-chained, branched-chained, and cyclic alkyl groups. As concrete examples of such an alkyl group, there can be cited a methyl group, an ethyl group, a propyl group, an isopropyl group, a butyl group, a pentyl group, a hexyl group, an octyl group, an isooctyl group, a 2-ethylhexyl group, a nonyl group, a decyl group, dodecyl group, an octadecyl group, a trifluoromethyl group, a pentafluoroethyl group, a perfluorohexyl group, a perfluorooctyl group, and so on, but the above alkyl group is not limited thereto.

In the R1 group, the R2 group, the R3 group, and the R4 group, it is preferable that carbon numbers of the substituted or unsubstituted aromatic group and hetero-aromatic group are in a range of 4 to 20. As concrete examples of such an aromatic group (aryl group) and a hetero-aromatic group (heteroaryl group), there can be cited a phenyl group, a naphthyl group, a 4-biphenyl group, a 2-thienyl group, a 2-furanyl group, a 4-tolyl group, 4-octylphenyl group, and so on, but the above aromatic group and the above hetero-aromatic group are not limited thereto.

In the R2 group, the R3 group, and the R4 group, the substituted or unsubstituted alkoxy group can be any one of straight-chained, branched-chained, and cyclic alkoxy groups. As concrete examples of such an alkoxy group, there can be cited a methoxy group, an ethoxy group, a propoxy group, a butoxy group, a hexyloxy group, an octyloxy group, a 2-ethylhexyloxy group, and so on, but the above alkoxy group is not limited thereto.

X, Y, and Z in the formula (1) indicate atoms selected from oxygen (O), sulfur (S), and selenium (Se). The X, Y, and Z can be the same atom or can be each different atom. Further, as halogen in the R2 group, in the R3 group, and in the R4 group, there can be cited fluorine (F), chlorine (Cl), bromine (Br), and iodine (I).

A weight-average molecular weight of the polymer which includes the repeating unit represented by the formula (1) is in a range of 3000 to 1000000. In such a case, excellent solubility and semiconductor characteristic can be obtained. It is preferable that the weight-average molecular weight of the polymer is in a range of 10000 to 400000. Note that the weight-average molecular weight indicates a weight-average molecular weight of polystyrene conversion measured by a gel permeation chromatograph method. Further, in order to grant an excellent solubility to the polymer, it is preferable that at least one selected from the R1 group, the R2 group, the R3 group, and the R4 group is a substituted or unsubstituted alkyl group or alkoxy group with a carbon number of 6 or more.

The repeating units represented by the formula (1) are sometimes bonded cyclically by themselves to constitute a polymer, but, in general, the repeating unit includes end groups (R5 group and R6 group) as represented by a formula (2) shown below.

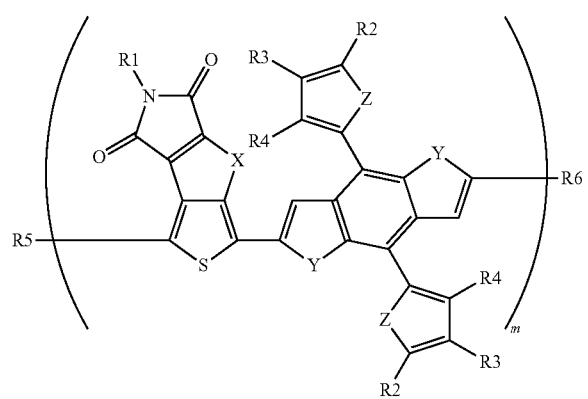

(2)

In the formula (2), R1, R2, R3, R4, X, Y, and Z are as described above. R5 and R6 each independently indicate a monovalent group selected from hydrogen, halogen, a substituted or unsubstituted alkyl group, a substituted or unsubstituted alkoxy group, a substituted or unsubstituted aromatic group, and a substituted or unsubstituted hetero-aromatic group. A symbol m indicates a number representing a polymerization degree.

A polymer having a structure represented by the formula (2) can include repeating units of two or more kinds whose substituents are different from each other in the repeating unit represented by the formula (1). Further, the polymer of the embodiment can include a repeating unit other than the repeating unit represented by the formula (1). When the number of moles of the repeating unit represented by the formula (1) is less than mol %, a semiconductor characteristic or the like based on the repeating unit represented by the formula (1) cannot be obtained sufficiently. It is preferable that a rate of the repeating unit represented by the formula (1) is 50 mol % or more in relation to the total number of the moles of all the repeating units in the polymer.

As a representative example of the polymer of the embodiment, the polymer having the structure represented by the formula (2) shown above can be cited. Concrete examples of the R5 group and the R6 group as the end groups are similar to the concrete examples of the R2 group and so on described above. Further, it is preferable that at least one selected from the R5 group and the R6 group is an aromatic group having an electron withdrawing group or an electron releasing group. As the aromatic group having the electron withdrawing group, there can be cited a 4-cyanophenyl group, a 4-trifluoromethylphenyl group, a 4-nitrophenyl group, a 4-methoxycarbonylphenyl group, a 2-(5-cyano)thienyl group, and so on. As the aromatic group having the electron releasing group, there can be cited a 4-methoxyphenyl group, an N,N-dimethylaminophenyl group, a tolyl group, a 2-(5-octyl)thienyl group, and so on.

In order to improve a durability of the polymer of the embodiment, it is preferable that at least one of the substituents (R1 to R4) in the formula (1) and the formula (2) is a cross-linking group. The cross-linking group can be introduced not only as the substituents (R1 to R4) but also as the end groups (R5 to R6). In other words, in the polymer having the structure represented by the formula (2), it is preferable that at least one of the R1 group to the R6 group is the cross-linking group. It suffices that the cross-linking group is a substituent which generates a cross-linking reaction by light, heat, a radical initiator, or the like. For example, as a cross-linking group which generates cross-linking as a result that a bond is resolved by light, there can be cited a substituent which includes an alkyl group or an alkoxy group where substitution is carried out by bromine or iodine, a substituent which includes an azo group or a diazo group, and so on.

The cross-linking group may be a substituent which includes a double bond or a triple bond of carbon-carbon that generates photodimerization by light, and a substituent which generates an addition reaction by heat. As the former, there can be exemplified an anthranyl group, a cinnamoyl group, a substituent which includes a coumarin structure, a phenylmaleimide group, a furfurylacrylate group, an acetylene group, and so on. As the latter, there can be exemplified benzocyclobutane, a cyclopentadienyl group, a substituent having a benzocyclobutane or sultine structure, and so on.

The cross-linking group can be a substituent which includes a multiple bond of carbon-carbon, for example, an acrylic group, a methacrylic group, or the like, as the substituent reacting as a radical initiator.

As concrete examples of the polymer of the embodiment, that is, as concrete examples of the polymer having the structure represented by the formula (2), there can be cited examples shown below. The polymer of the embodiment is not limited to the concrete examples shown below. Note that "Ph" in the formula indicates a phenyl group.

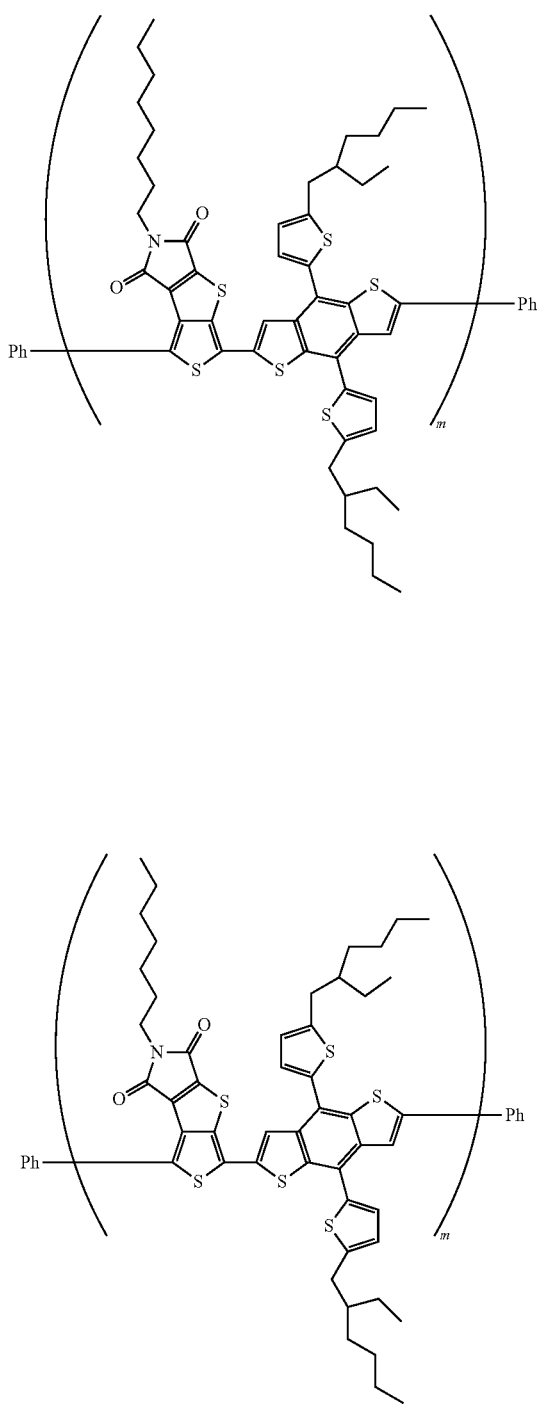

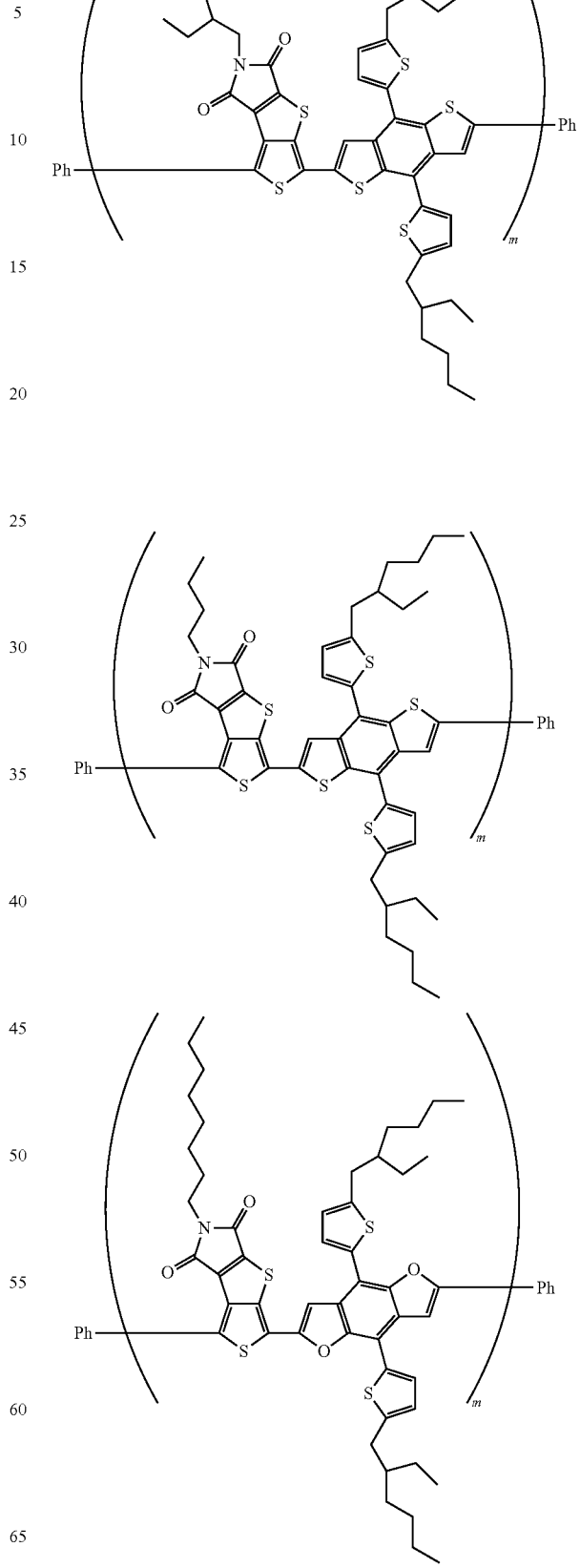

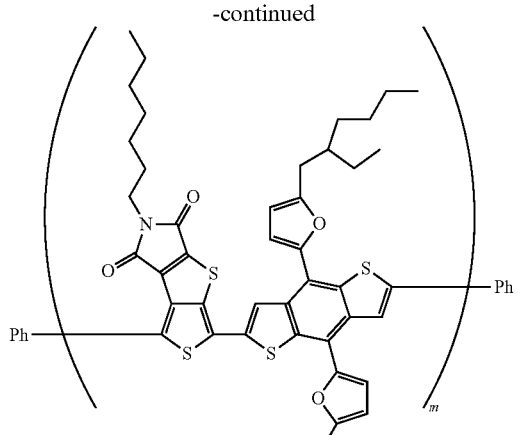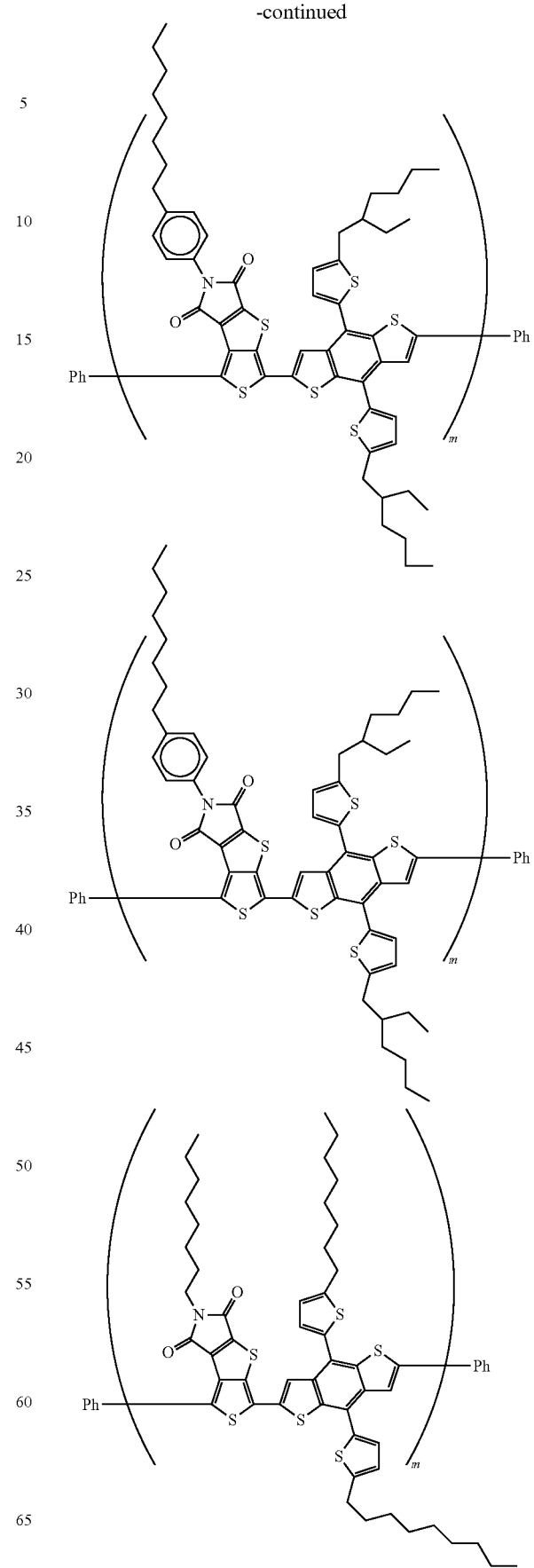

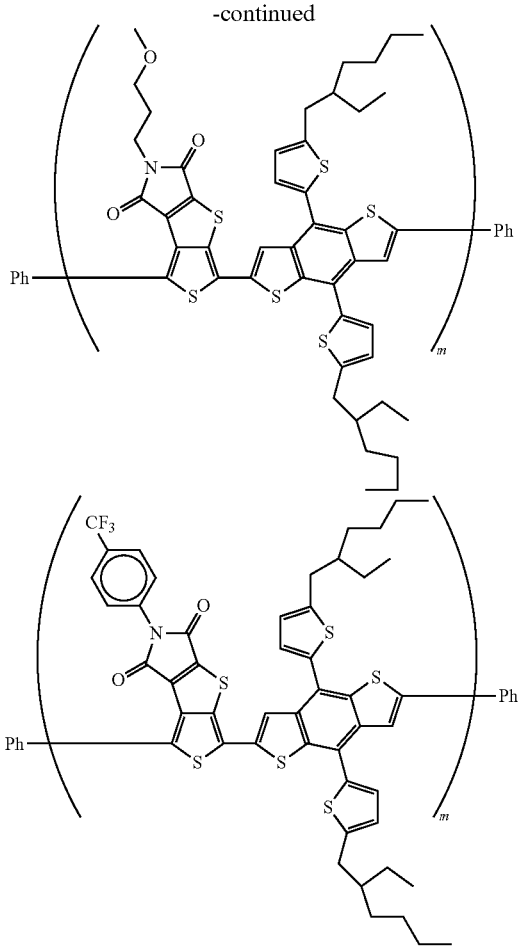
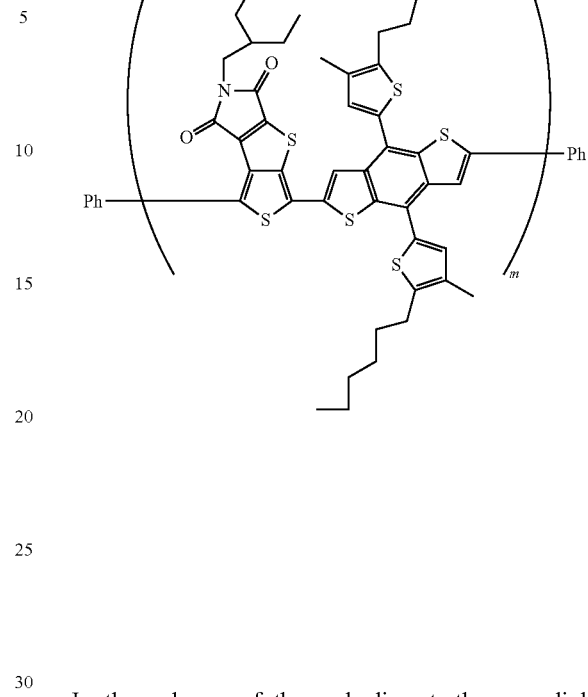
In the polymer of the embodiment, the cross-linking group can be introduced, not only as a substituent of a repeating unit as a main component, but also as a substituent of a repeating unit as a second component. In other words, the polymer of the embodiment can have a structure represented by a formula (3) shown below.
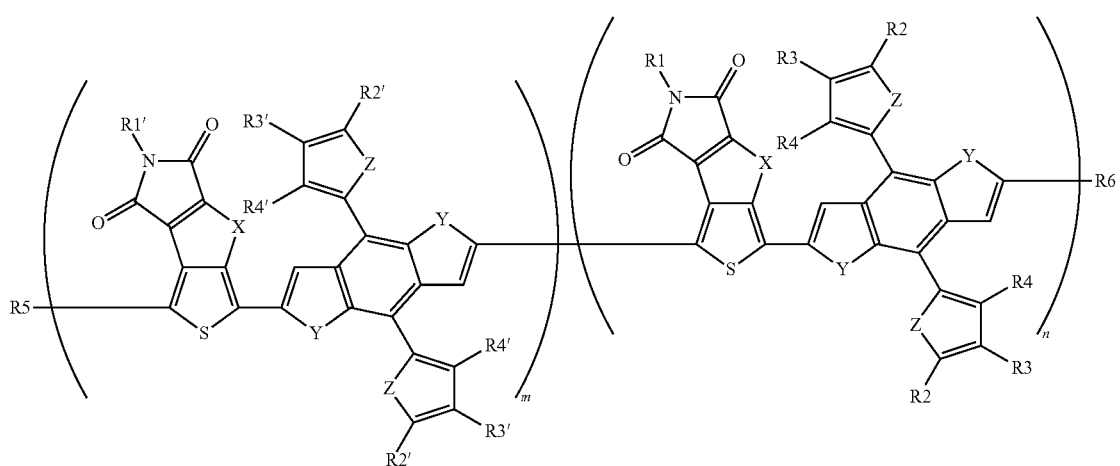
(3)

In the formula (3), R1, R2, R3, R4, R5, R6, X, Y, and Z are as described above. R1' indicates a monovalent group selected from hydrogen, a substituted or unsubstituted alkyl group, a substituted or unsubstituted aromatic group, and a substituted or unsubstituted hetero-aromatic group. R2', R3', and R4' each independently indicate a monovalent group selected from hydrogen, halogen, a substituted or unsubstituted alkyl group, a substituted or unsubstituted alkoxy group, a substituted or unsubstituted aromatic group, and a substituted or unsubstituted hetero-aromatic group, at least one of the above being a cross-linking group. Symbols m and n indicate numbers representing polymerization degrees of respective repeating units.

In a polymer having a structure represented by the formula (3), at least one selected from the R2' group, the R3' group, and the R4' group is a cross-linking group. A concrete example of the cross-linking group is as described above. The polymer can have a repeating unit which does not include the cross-linking group and a repeating unit which includes the cross-linking group. The polymer having the structure represented by the formula (3) can be a random copolymer which includes the respective repeating units in a random order, and also can be a block copolymer which includes blocks of respective repeating units. A proportion of the polymerization degrees (m and n) of the respective repeating units is not limited in particular, but is to be set properly in correspondence with a cross-linking state of the object polymer. As a concrete example of the polymer having the structure represented by the formula (3), one shown below can be cited.

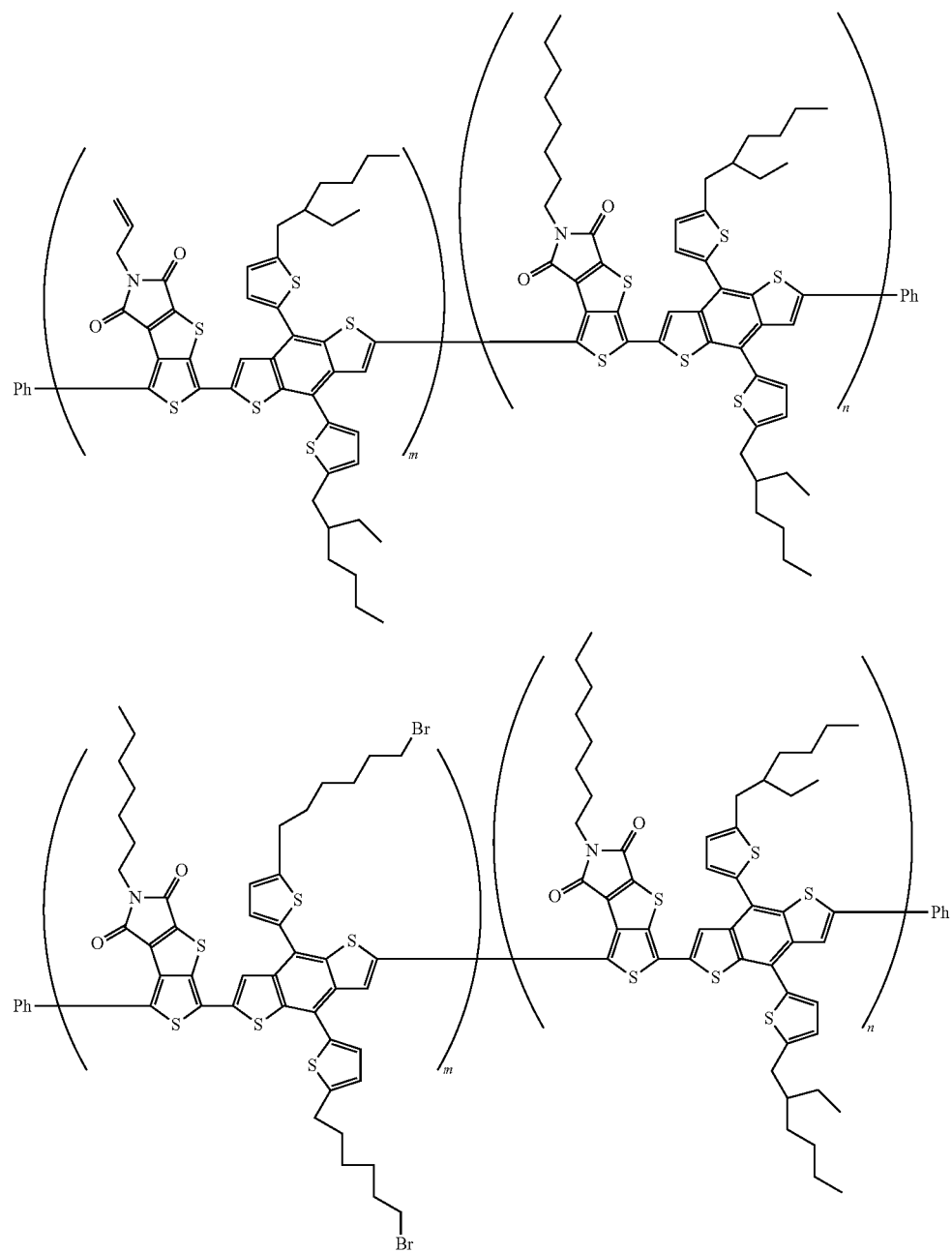

Further, the polymer of the embodiment can include not only the repeating unit represented by the formula (1) but also another repeating unit. In other words, the polymer of the embodiment can include a structure represented by a formula (4) shown below.

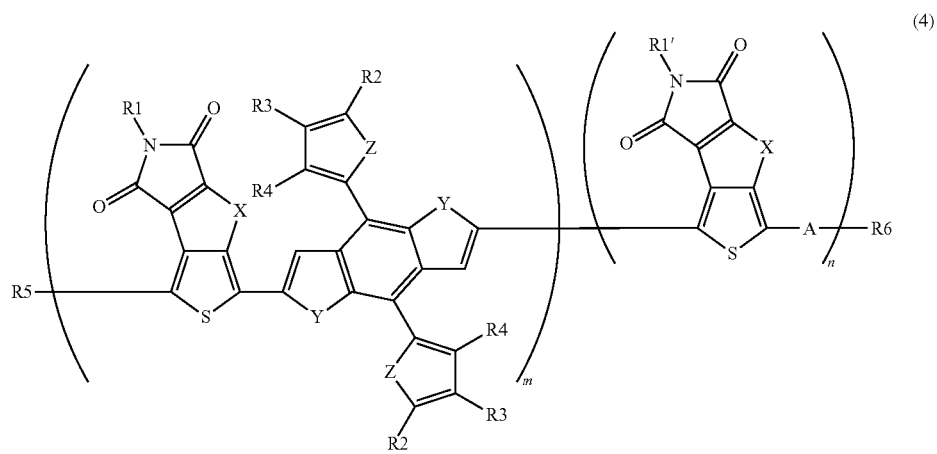

In the formula (4), R1, R2, R3, R4, R5, R6, X, Y, and Z are as described above. R1' indicates a monovalent group selected from hydrogen, a substituted or unsubstituted alkyl group, a substituted or unsubstituted aromatic group, and a substituted or unsubstituted hetero-aromatic group. A indicates a divalent group selected from a substituted or unsubstituted aromatic group and a substituted or unsubstituted hetero-aromatic group. Symbols m and n indicate numbers representing polymerization degrees of respective repeating units.

In the polymer having the structure represented by the formula (4), the A indicates the divalent group selected from the substituted or unsubstituted aromatic group and the substituted or unsubstituted hetero-aromatic group. As concrete examples thereof, there can be cited a 1,4-phenylene group, a 1,5-naphthylene group, a 2,5-thienyl group, a 2,5-furanyl group, a 4-tolyl group, a 2,5-pyrrolene group, 1,6-pyrenylene group, and so on, but the above divalent groups are not limited thereto. In the formula (4), when a rate, in relation to the repeating unit (polymerization degree m) represented by the formula (1), of the other repeating unit (polymerization degree n) is too large, a semiconductor characteristic or the like based on the repeating unit represented by the formula (1) cannot be obtained sufficiently. Thus, it is preferable that a value of n/(n+m) is in a range of 0.01 to 0.5. As a concrete example of the polymer having the structure represented by the formula (4), one shown below can be cited.

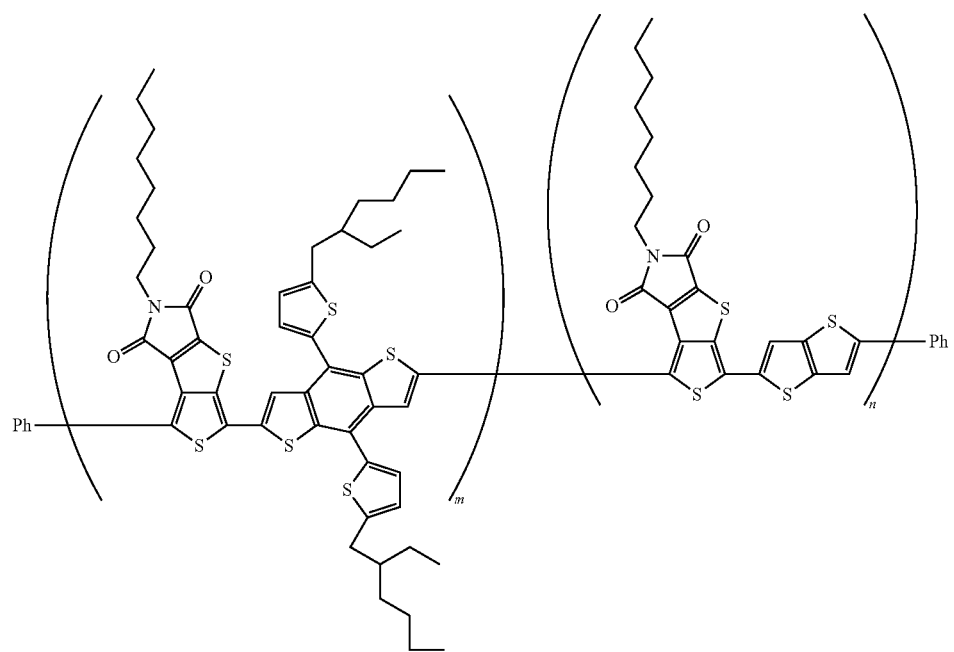
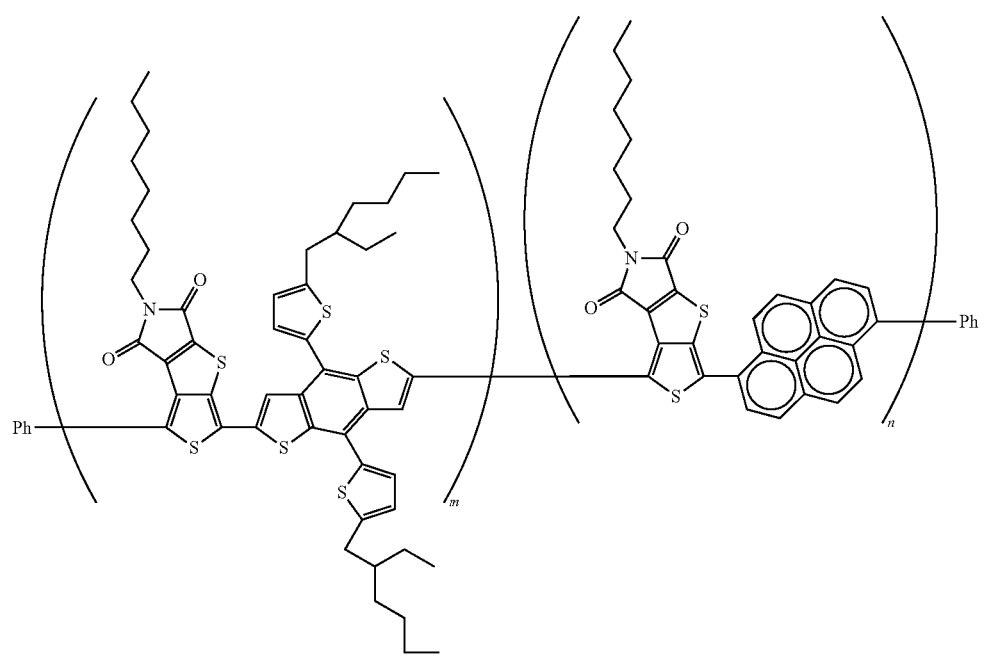

-continued

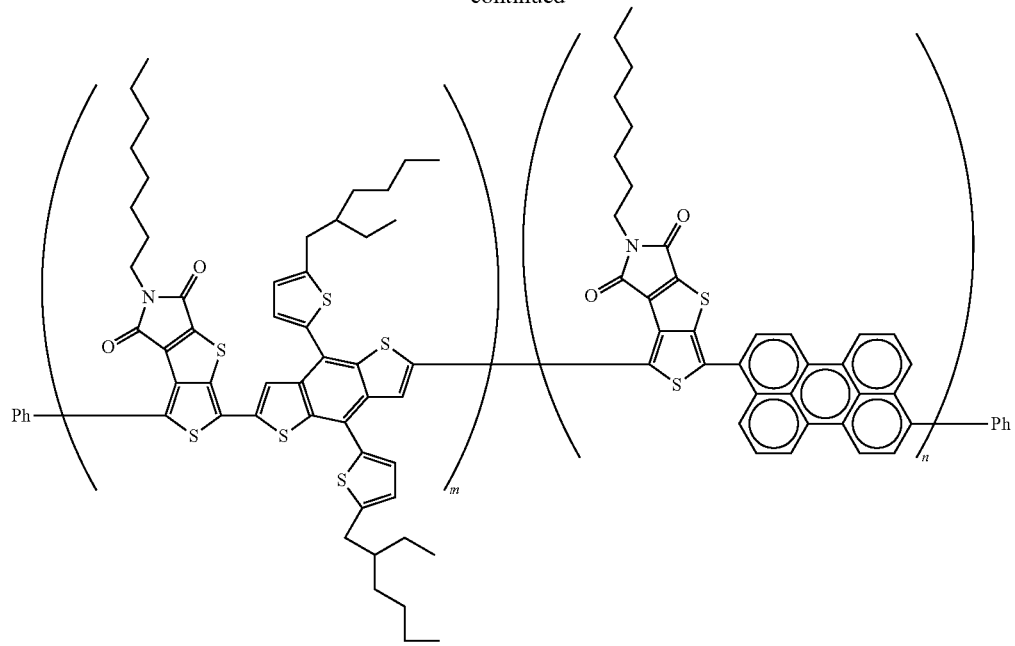

{Method for Synthesizing High Molecule Compound}

A method for synthesizing the polymer of the embodiment is not limited in particular. The polymer of the embodiment can be synthesized as a result that, after a monomer having a functional group suitable for a polymerization reaction to be used is synthesized, for example, the monomer is dissolved in an organic solvent as necessary and polymerized by using a known aryl coupling reaction in which alkali, a catalyst, a ligand, or the like is used. As a polymerization method by the aryl coupling reaction, there can be cited a polymerization method by a Stille coupling reaction, a Suzuki coupling reaction, and so on, for example.

Polymerization by a Stille coupling is a method in which while a palladium complex being used as a catalyst and a ligand being added as necessary, a monomer that has a trialkyltin residue are reacted with a monomer that has a halogen atom such as a bromine atom, an iodine atom, and a chlorine atom. As the palladium complex, there can be cited palladium[tetrakis(triphenylphosphine)], [tris(dibenzylideneacetone)]dipalladium, palladiumacetate, and bis(triphenylphosphine)palladiumdichloride, for example. Details of polymerization by the Stille coupling reaction is described in International Publication No. 2010/008672, for example. As a solvent used in the Stille coupling reaction, an organic solvent such as toluene, xylene, N,N-dimethylacetamide, N,N-dimethylformamide, and a mixed solvent made by mixing two or more kinds of the above is used. The solvent used in the Stille coupling reaction is not limited to the above-described solvent. In order to suppress a side reaction, it is preferable that the solvent is subjected to a deoxidization processing before a reaction.

Polymerization by a Suzuki coupling reaction is a method in which, under existence of an inorganic base or an organic base, while a palladium complex or a nickel complex being used as a catalyst and a ligand being added as necessary, a monomer that has a boronic acid residue or a boric acid ester residue is made to react with a monomer that has a halogen atom such as a bromine atom, an iodine atom, and a chlorine atom, or a monomer that has a sulfonate group such as a trifluoromethanesulfonate group and a p-toluenesulfonate group.

As the inorganic base, there can be cited a sodium carbonate, a potassium carbonate, a cesium carbonate, a tripotassium phosphate, a potassium fluoride, and so on, for example. As the organic base, there can be cited a tetrabutylammonium fluoride, a tetrabutylammonium chloride, a tetrabutylammonium bromide, a tetraethylammonium hydroxide, and so on, for example. As the palladium complex, there can be cited palladium[tetrakis(triphenylphosphine)], [tris(dibenzylideneacetone)]dipalladium, palladiumacetate, bis(triphenylphosphine)palladiumdichloride, and so on, for example. As the nickel complex, bis(cyclooctadiene)nickel, for example, can be cited. As the ligand, there can be cited triphenylphosphine, tri(2-methylphenyl)phosphine, tri(2-methoxyphenyl)phosphine, diphenylphosphinopropane, tri(cyclohexyl)phosphine, tri(tert-butyl)phosphine, and so on, for example. Details of polymerization by the Suzuki coupling reaction is described in Journal of Polymer Science: Part A: Polymer Chemistry, Vol. 39, p 1533-1, 2001, for example.

In polymerization by the aryl coupling reaction, a normal solvent is used. It suffices that the solvent is selected in consideration of a polymerization reaction to be used, solubilities of a monomer and a polymer, and so on. Concretely, there can be cited an organic solvent such as tetrahydrofuran, toluene, 1,4-dioxane, dimethoxyethane, N,N-dimethylacetamide, N,N-dimethylformamide, a mixed solvent made by mixing two or more kinds of the above, a solvent having two phases of an organic solvent phase and an aqueous phase, or the like. In the Suzuki coupling reaction, it is preferable to use an organic solvent such as tetrahydrofuran, toluene, 1,4-dioxane, dimethoxyethane, N,N-dimethylacetamide, N,N-dimethylformamide, a mixed solvent made by mixing two or more kinds of the above, or a solvent having two phases of an organic solvent phase and an aqueous phase. In order to suppress a side reaction, it is preferable that the solvent used in the Suzuki coupling reaction is subjected to a deoxidization processing before a reaction.

A reaction temperature of the aryl coupling reaction is preferable to be −100° C. or more in view of a reactivity, more preferable to be −20° C. or more, and particularly preferable to be 0° C. or more. The reaction temperature is preferable to be 200° C. or less in view of a stability of a monomer and a high molecular compound, more preferable to be 150° C. or less, and particularly preferable to be 120° C. or less. In polymerization by the awl coupling reaction, a known method can be applied to extraction of a polymer from a reaction solution after the reaction. For example, the polymer of the embodiment can be obtained as a result that a reaction solution is added to a lower alcohol such as methanol, that a precipitated deposit is filtered, and that a filtered material is dried. When a purity of the obtained polymer is low, the polymer can be refined by recrystallization, continuous extraction by a Soxhlet extractor, column chromatography, or the like.

The polymer of the embodiment can be synthesized by using the Stille coupling reaction. For example, the polymer of the embodiment is synthesized by polymerizing a bis(trialkyl)tin compound represented by a formula (5) and a dihalogen compound represented by a formula (6).

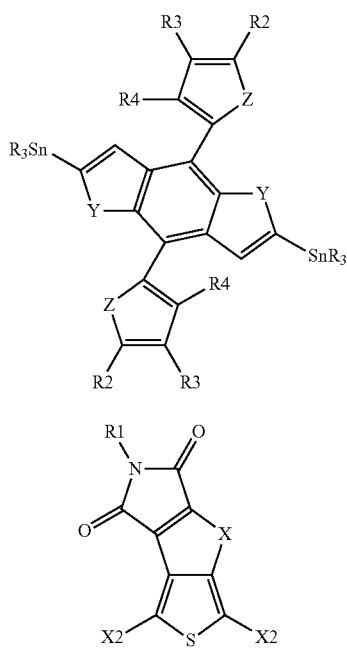

In the formula (5) shown above, R indicates an alkyl group, and there can be cited a methyl group, a butyl group, an octyl group, and so on, for example. In the formula (6), X2 indicates halogen, and is F, Cl, Br, I, or the like. R1 of the formula (6) indicates a monovalent group selected from hydrogen, a substituted or unsubstituted alkyl group, a substituted or unsubstituted aromatic group, and a substituted or unsubstituted hetero-aromatic group. R2, R3, and R4 of the formula (5) each independently indicate a monovalent group selected from hydrogen, halogen, a substituted or unsubstituted alkyl group with a carbon number of 1 to 30, a substituted or unsubstituted alkoxy group with a carbon number of 1 to 30, a substituted or unsubstituted aromatic group, and a substituted or unsubstituted hetero-aromatic group. X indicates an atom selected from O, S, and Se. Halogen of the above is F, Cl, Br, or I.

In the formula (5) and the formula (6), the alkyl group as the substituent (R1 to R4) can be either chained or cyclic, and concretely, there can be cited a methyl group, an ethyl group, a propyl group, an isopropyl group, a butyl group, a pentyl group, a hexyl group, an octyl group, an isooctyl group, a 2-ethylhexyl group, a nonyl group, a decyl group, a dodecyl group, an octadecyl group, a trifluoromethyl group, a pentafluoroethyl group, a perfluorohexyl group, a perfluorooctyl group, and so on. The alkoxy group as the substituent (R1 to R4) can be either chained or cyclic, and concretely, there can be cited a methoxy group, an ethoxy group, a propoxy group, a butoxy group, a hexyloxy group, an octyloxy group, a 2-ethylhexyloxy group, and so on. As concrete examples of the aromatic group and the hetero-aromatic group, there can be cited a phenyl group, a naphthyl group, a 4-biphenyl group, a 2-thienyl group, a 2-furanyl group, a 4-tolyl group, a 4-octylphenyl group, and so on. In order to obtain an excellent solubility of the polymer, it is preferable that at least one of the substituents R1 to R4 is a substituted or unsubstituted alkyl group and alkoxy group with a carbon number of 6 or more. In order to improve a durability of the polymer, it is preferable that at least one of the substituents R1 to R4 is a cross-linking group. The concrete example of the cross-linking group is as described above.

As a concrete example of the compound represented by the formula (5), one shown below can be cited.

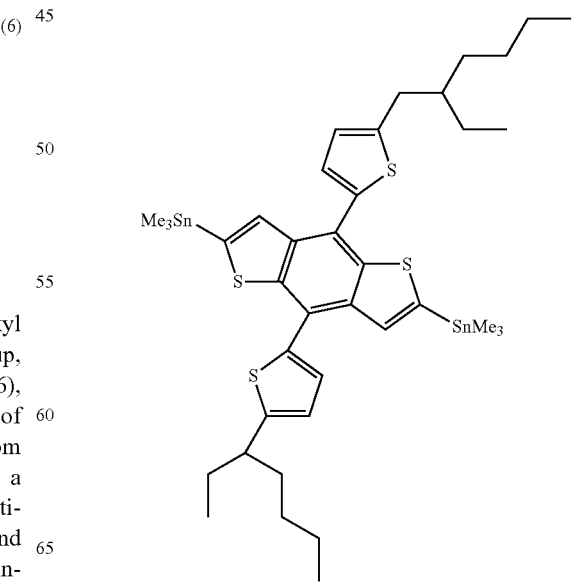

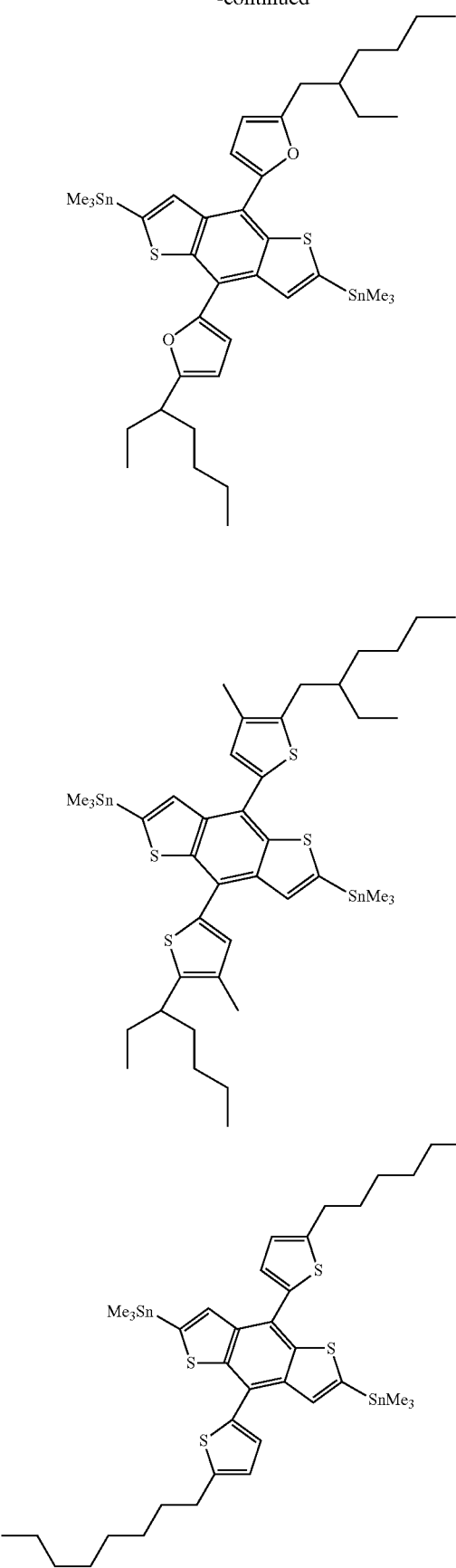
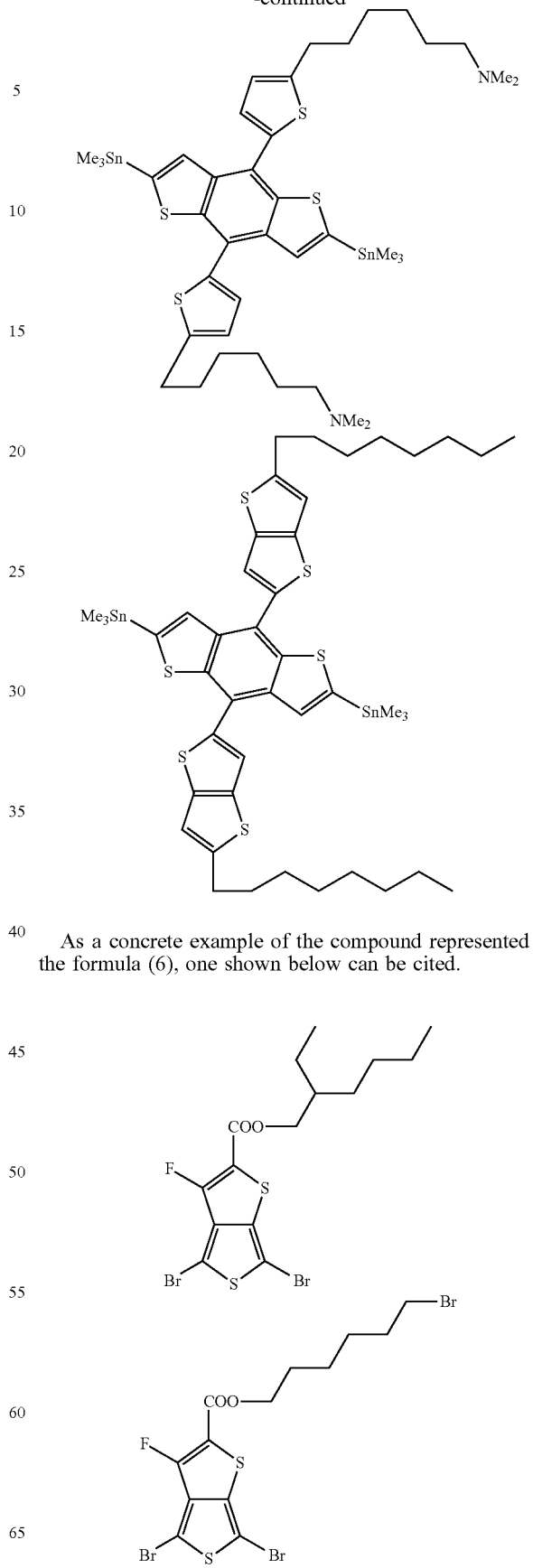
As a concrete example of the compound represented by the formula (6), one shown below can be cited.

-continued

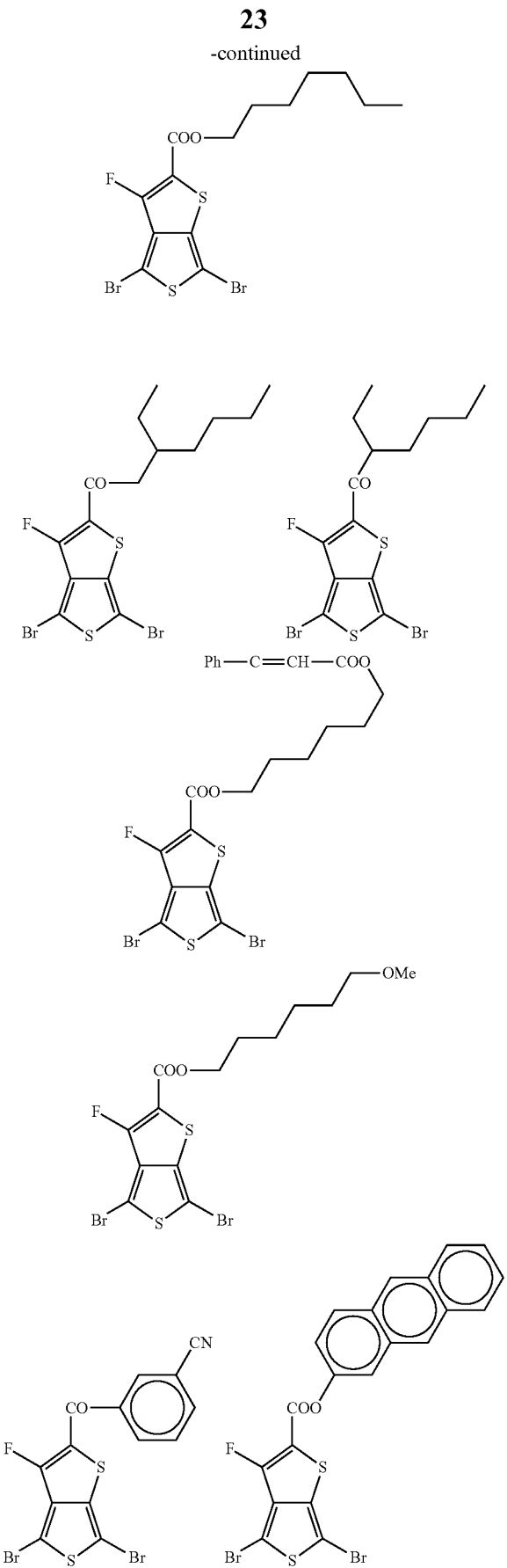

-continued

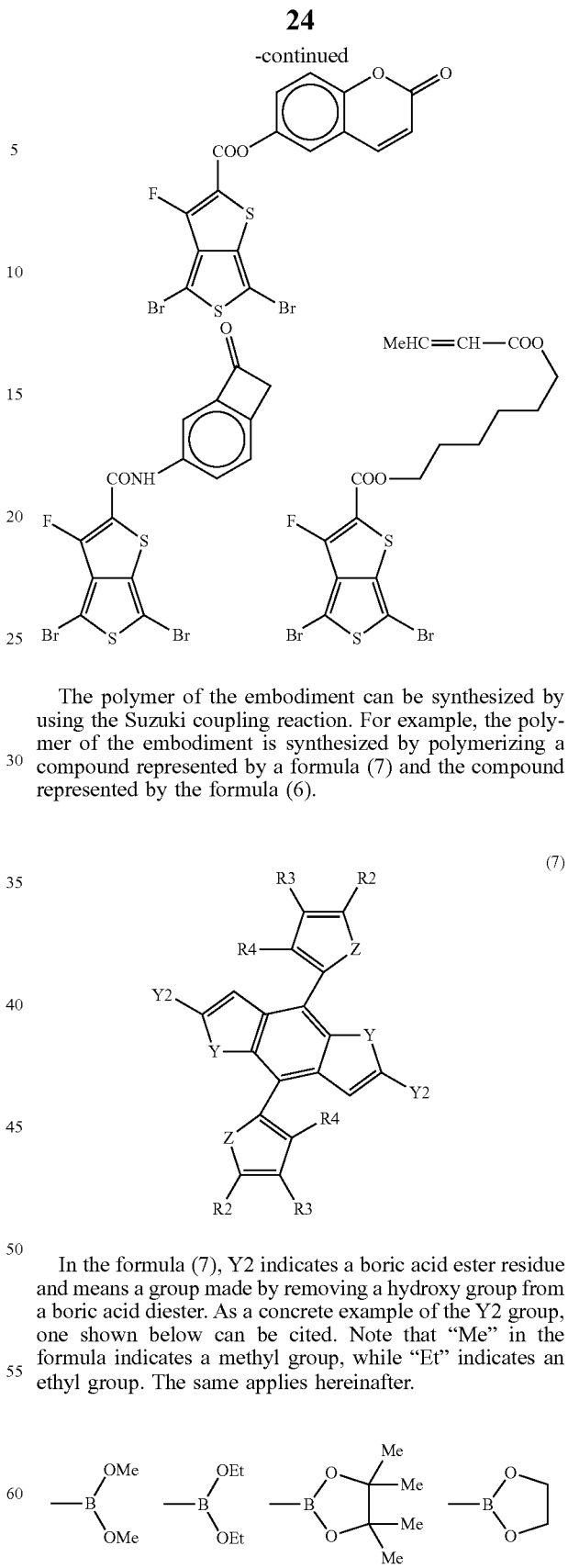

The polymer of the embodiment can be synthesized by using the Suzuki coupling reaction. For example, the polymer of the embodiment is synthesized by polymerizing a compound represented by a formula (7) and the compound represented by the formula (6).

In the formula (7), Y2 indicates a boric acid ester residue and means a group made by removing a hydroxy group from a boric acid diester. As a concrete example of the Y2 group, one shown below can be cited. Note that "Me" in the formula indicates a methyl group, while "Et" indicates an ethyl group. The same applies hereinafter.

{Solar Cell}

A solar cell of the embodiment includes a photoelectric conversion element which has a pair of electrodes and an active layer disposed therebetween. The active layer has a p-type semiconductor material (electron donor) which include the aforementioned polymer of the embodiment and an n-type semiconductor material (electron acceptor). The photoelectric conversion element which has such an active layer can be applied not only to a solar cell but also to a photosensor or a light emitting element.

Hereinafter, the solar cell of the embodiment will be described with reference to FIG. 1. A solar cell element 100 shown in FIG. 1 has a first electrode 120, a second electrode 160, and an active layer 140 disposed between the electrodes 120, 160. FIG. 1 shows a solar cell element (photoelectric conversion element) used for a general organic thin film solar cell, but a structure of the solar cell element is not limited thereto. The solar cell element 100 of the embodiment can further have a substrate 110 and buffer layers 130, 150. The first electrode 120 is an electrode (hereinafter, sometimes denoted as an anode) to collect a hole. The second electrode 160 is an electrode (hereinafter, sometimes denoted as a cathode) to collect an electron. In FIG. 1, the anode 120 is disposed in a substrate 110 side, but the anode 120 and the cathode 160 can be reversed. The buffer layer 130 and the buffer layer 150 can be reversed. These respective parts will be described.

<Active Layer (140)>

The active layer 140 in the solar cell element 100 of the embodiment includes the p-type semiconductor material (electron donor) and the n-type semiconductor material (electron acceptor). The p-type semiconductor material has the polymer of the embodiment, that is, the polymer which includes the repeating unit represented by the formula (1) and whose weight-average molecular weight is in a range of 3000 to 1000000 or less. A concrete configuration of the polymer as the p-type semiconductor material is as described above. Hereinafter, the n-type semiconductor material (electron acceptor) will be described in detail. The active layer 140 can include a plurality of kinds of p-type semiconductor materials, and similarly, can include a plurality of kinds of n-type semiconductor materials.

<N-Type Semiconductor Material>

As the n-type semiconductor material (electron acceptor) included in the active layer 140, there can be cited a phthalocyanine derivative, a fullerene or a fullerene derivative, a boron-containing polymer, poly(benzobisimidazobenzophenanthroline), and so on, but the n-type semiconductor material included in the active layer 140 is not limited thereto. Among the above, the fullerene derivative is preferable. As concrete examples of the fullerene derivative, there can be cited 1',1'',4'4'''-tetrahydro-di[1,4]methanonaphthaleno[1,2:2',3',56,60:2'',3''][5,6]fullerene-C60(indene-$C_{60}$bis adduct: IC60BA), [6,6]-phenyl C61 butyric acid methyl ester (PC60BM), [6,6]-phenyl C71 butyric acid methyl ester (PC70BM), dihyrdonaphtyl-based[60]fullerene bisadducts (NC60BA), dihyrdonaphtyl-based[70]fullerene bisadducts (NC70BA), and so on, but the fullerene derivative is not limited thereto.

<Configuration and Structure of Active Layer>

In order to transfer an electron from the electron donor (p-type semiconductor) to the electron acceptor (n-type semiconductor) efficiently, a relativity of LUMO energy levels between the p-type semiconductor material and the n-type semiconductor material is important. Concretely, it is preferable that the LUMO energy level of the p-type semiconductor material is higher than the LUMO energy level of the n-type semiconductor material by a predetermined energy. In other words, it is preferable that an electron affinity of the p-type semiconductor material is larger than an electron affinity of the n-type semiconductor material by the predetermined energy.

If the LUMO energy level of the n-type semiconductor material is too high, transfer of the electron is hard to occur, and thus a short circuit current (Jsc) of the solar cell element 100 tends to become low. On the other hand, an open circuit voltage (Voc) of the solar cell element is determined by a difference between a HOMO energy level of the p-type semiconductor material and the LUMO energy level of the n-type semiconductor material. Therefore, if the LUMO energy level of the n-type semiconductor material is too low, the Voc tends to become low. In order to realize a higher conversion efficiency, it is not enough to simply select the n-type semiconductor material whose LUMO energy level is high or whose LUMO energy level is low.

The aforementioned polymer of the embodiment can adjust the LUMO energy level by selecting its substituent. That is, as a result of changing substituents of two kind of monomers constituting a copolymer, compounds having various energy levels can be obtained. In order to obtain the monomer having various substituents, a known technique such as esterification, etherification, and cross-coupling, for example, can be used. However, a suitable combination of a p-type semiconductor material and an n-type semiconductor material is not simply determined only by a LUMO energy level and a HOMO energy level.

In the solar cell element 100, light is absorbed by the active layer 140, charge separation occurs in an interface between the p-type semiconductor and the n-type semiconductor, and a hole and an electron which have been generated are extracted from the electrodes 120, 160. A thickness of the active layer 140 is not limited in particular, but the thickness of the active layer is preferable to be from 10 nm to 1000 nm, and is further preferable to be from 50 nm to 250 nm. By making the thickness of the active layer 10 nm or more, uniformity of the layer is maintained and a short circuit becomes hard to occur. By making the thickness of the active layer 1000 nm or less, an internal resistance can be made small, and as a result that a distance between the electrodes 120, 160 becomes closer, diffusion of electric charges are made better.

As concrete structures of the active layer 140, there can be cited a thin film laminated type in which a p-type semiconductor layer and an n-type semiconductor layer are laminated, and a bulk hetero junction type in which a p-type semiconductor material and an n-type semiconductor material are mixed. The active layer 140 of the thin film laminated type is disposed between the p-type semiconductor layer and the n-type semiconductor layer, and can have a layer (i layer) in which the p-type semiconductor material and the n-type semiconductor material are mixed. It is preferable that the solar cell element 100 of the embodiment has the active layer 140 including the bulk hetero junction structure in which the p-type semiconductor material and the n-type semiconductor material are mixed.

The bulk hetero junction type active layer 140 includes the p-type semiconductor material and the n-type semiconductor material. In the active layer 140, a p-type semiconductor phase and an n-type semiconductor phase are phase separated from each other. When the active layer 140 absorbs light, a positive charge (hole) and a negative charge (electron) are separated in the interface of the phase thereof, and transferred to the electrodes 120, 160 through the respective semiconductors. In the bulk hetero junction type active layer 140, the phase-separated structure of the p-type semiconductor phase and the n-type semiconductor phase affects a light absorption process, a diffusion process of excitons, a dissociation process of the excitons (charge generation process), and a carrier transportation process. Therefore, in order to heighten a photoelectric conversion efficiency of the solar cell element 100, it is preferable to make the phase-separated structure of the p-type semiconductor phase and the n-type semiconductor phase in the active layer 140 appropriate.

<Forming Method of Active Layer>

A forming method of the active layer 140 is not limited in particular, but it is preferable to apply a wet coating method such as a spin coat method, an ink-jet method, a doctor blade method, and a drop casting method. In this case, a solvent is selected in which the p-type semiconductor material (polymer which includes the repeating unit represented by the formula (1)) and the n-type semiconductor material are soluble, and a coating solution which includes the p-type semiconductor material made of the polymer and the n-type semiconductor material are fabricated. By applying this coating solution, the bulk hetero junction type active layer 140 can be formed.

Kinds of the solvents are not limited in particular as long as the solvent can dissolve a semiconductor material uniformly. The solvent can be selected, for example, from aliphatic hydrocarbons such as hexane, heptane, octane, isooctane, nonane, and decane, aromatic hydrocarbons such as toluene, xylene, chlorobenzene, and orthodichlorobenzene, low alcohols such as methanol, ethanol, and propanol, ketones such as acetone, methyl ethyl ketone, cyclopentanone, and cyclohexanone, esters such as ethyl acetate, butyl acetate, and methyl lactate, halogen hydrocarbons such as chloroform, methylene chloride, dichloroethane, trichloroethane, and trichloroethylene, ethers such as ethyl ether, tetrahydrofuran, and dioxane, amides such as dimethylformamide and dim ethylacetamide.

<Additive to Active Layer Coating Solution>

In a case where the bulk hetero junction type active layer 140 is to be formed by a coating method, addition of a compound with a low molecular weight to a coating solution sometimes improves a photoelectric conversion efficiency. As a mechanism where a phase separation structure is optimized by the additive and the photoelectric conversion efficiency is improved, a plurality of causes can be considered. As one of the causes, it is considered that existence of the additive suppresses aggregation of p-type semiconductor materials to each other or of n-type semiconductor materials to each other. In other words, without the additive, a solvent of the active layer coating solution (ink) normally volatilizes immediately after coating. It is considered that the p-type semiconductor material and the n-type semiconductor material which remain as residual components on this occasion each form a large aggregate. In such a case, a joint area (area of an interface) between the p-type semiconductor material and the n-type semiconductor material becomes small, and a generation efficiency of a charge is lowered.

When the ink which includes the additive is applied, the additive remains for a while after volatilization of the solvent. In other words, since the additive exists in the p-type semiconductor material or in the n-type semiconductor material, or in peripheries of the both, aggregation of the p-type semiconductor material and/or the n-type semiconductor material is prevented. It is considered that the additive evaporates at a low speed under a room temperature and a normal pressure after application of the ink. The p-type semiconductor material and the n-type semiconductor material are considered to aggregate as the additive evaporates. Since the remaining additive prevents aggregation, aggregates which the p-type semiconductor material and the n-type semiconductor material form are smaller. Consequently, in the active layer 140 is formed a phase separation structure in which the joint area of the p-type semiconductor material and the n-type semiconductor material is large and which has a higher charge generation efficiency.

As described above, it is preferable that the additive remains in the active layer 140 for a while after volatilization of a main solvent of the ink. From such a viewpoint, it is preferable that a boiling point of the additive is higher than that of the main solvent of the ink. Since boiling points of chlorobenzene and orthodichlorobenzene, which are often used as main solvents of ink, are 131° C. and 181° C., respectively, it is preferable that a boiling point of the additive under the normal pressure (1000 hPa) is higher than the above. From a similar viewpoint, it is preferable that a vapor pressure of the additive is lower than a vapor pressure of the main solvent of the ink under the room temperature (25° C.). If the boiling point of the additive is too high, the additive does not disappear completely from the active layer 140 after fabrication of an element, and it is supposed that an amount of the additive remaining in the active layer 140 increases. In such a case, it is considered that increase of impurities causes reduction of a mobility, that is, reduction of the photoelectric conversion efficiency. Therefore, it is preferable that the boiling point of the additive is not too high.

The boiling point of the additive under the normal pressure is preferable to be higher than the boiling point of the main solvent by a range of 10° C. or more to 200° C. or less, and further, is more preferable to be higher than the boiling point of the main solvent by a range of 50° C. or more to 100° C. If the boiling point of the additive is too low, aggregation of the n-type semiconductor material in particular is apt to occur at a time of drying of the ink. Consequently, a morphology of the active layer 140 becomes large, and there is a possibility that a surface becomes uneven. It is preferable that the additive is liquid under the room temperature (25° C.) in view of facilitating ink fabrication. If the additive is solid under the room temperature, it is considered that dissolving the additive in the main solvent at the time of ink fabrication is difficult or that a long stirring time is required even if the additive is dissolved. In order to optimize the phase separation structure of the active layer 140, not only the boiling point of the additive but also compatibility of the additive with the p-type semiconductor material and the n-type semiconductor material is also important. In other words, since the additive interacts with the p-type semiconductor material and the n-type semiconductor material, there is a possibility that a crystallinity or the like of the p-type semiconductor material or the n-type semiconductor material changes depending on a structure of the additive, for example.

As concrete examples of the additive, there can be cited an aromatic compound such as alkane having a substituent and naphthalene having a substituent. As the substituent, there can be cited an aldehyde group, an oxo group, a hydroxy group, an alkoxy group, a thiol group, a thioalkyl group, a carboxyl group, an ester group, an amine group, an amide group, a fluoro group, a chloro group, a bromo group, an iodine group, a nitrile group, an epoxy group, an aromatic group, and so on. The substituent can be single or can be plural. As the substituent which alkane has, the thiol group or the iodine group is preferable. As the substituent which the aromatic compound such as naphthalene has, the bromo group or the chloro group is preferable. Since it is preferable that the additive has the high boiling point as described above, a carbon number of alkane is preferable to be 6 or more, and is more preferable to be 8 or more. Since it is preferable that the additive is liquid under the room temperature as described above, the carbon number of the alkane is preferable to be 14 or less and further preferable to be 12 or less.

It is preferable that an amount of the additive included in the ink (active layer coating solution) is 0.1 mass % or more to 10 mass % or less in relation to the entire ink. Further, it is more preferable that the above amount is 0.5 mass % or more to 3 mass % or less in relation to the entire ink. By setting the amount of the additive in such a range, a preferable phase separation structure can be obtained while the additive remaining in the active layer 140 is decreased.

<Electrodes (120, 160)>

The electrodes 120, 160 in the solar cell 100 of the embodiment have a function to collect a hole or an electron generated as a result of absorption of light by the active layer 140. Therefore, it is preferable that the first electrode 120 is suitable for collection of the hole, and it is preferable that the second electrode 160 is suitable for collection of the electron. It is preferable that at least one of the pair of electrodes 120, 160 has a light transmitting property and it is possible that the both have the light transmitting properties. Having the light transmitting property means that 40% or more of sunlight is transmitted. It is preferable that the electrode having the light transmitting property transmits 70% or more of sunlight, and thereby light becomes easy to be made to be transmitted through a transparent electrode and to reach the active layer 140. A transmittance of light can be measured by a common spectrophotometer, and an average transmittance of visible light (400 nm to 800 nm) is indicated, for example.

<Electrode (Anode) 120 Suitable for Collection of Hole>

The anode 120 suitable for collection of the hole is generally an electrode constituted by a conductive material exhibiting a higher value of work function than the cathode 160. According to such an anode 120, the hole generated in the active layer 140 can be extracted smoothly. As forming materials of the anode 120, there can be cited, for example, a conductive metal oxide such as a nickel oxide, a tin oxide, an indium oxide, a tin indium oxide (ITO), an indium-zirconium oxide (IZO), a titanium oxide, and a zinc oxide, a metal such as gold, platinum, silver, chromium, and cobalt, or alloys of the above. These materials are preferable since these materials have high work functions. When the anode 120 is a transparent electrode, it is preferable to use a conductive metal oxide having a light transmitting property such as the ITO, the zinc oxide, and the tin oxide, a complex or a laminated body of a metal nanowire of Au, Ag, Cu, etc. or a carbon nanotube (CNT) and the conductive metal oxide, or a complex or a laminated body of the metal nanowire of Au, Ag, Cu, etc. or the carbon nanotube (CNT) and a conductive high molecule, and it is preferable to use ITO, in particular.

The aforementioned materials are preferable since the aforementioned materials can be laminated with a conductive high molecular material represented by REDOT/PSS made by doping a polystyrene sulfonic acid into a polythiophene derivative. For example, it is possible to provide a buffer layer 130 constituted by the conductive high molecular material between the anode 120 and the active layer 140. When laminating the conductive high molecular material, a metal suitable for the anode 120 such as aluminum and magnesium can be used instead of the above-described material having the high work function, since a work function of the conductive high molecular material is high. It is possible to use the conductive high molecular material itself as the material for the anode 120. As the conductive high molecular material, there can be cited the aforementioned PEDT/PSS, a material made by doping iodine or the like into polypyrrole, polyaniline, or the like, and so on.

A film thickness of the anode 120 is not limited in particular, but the film thickness is preferable to be 10 nm or more to 1 μm or less and is further preferable to be 50 nm or more to 300 nm or less. If the film thickness of the anode 120 is too thin, a sheet resistance becomes high, and if the film thickness of the anode 120 is too thick, a light transmittance is lowered. In a case where the anode 120 is the transparent electrode, it is preferable to select a film thickness so that both a high light transmittance and a low sheet resistance can be obtained. The sheet resistance of the anode 120 is not limited in particular, but is normally 1Ω/□ or more, and is preferable to be 500Ω/□ or less and more preferable to be 200Ω/□ or less. In view of extracting a larger current, it is preferable that the sheet resistance is small.

As forming methods of the anode 120, there can be cited a vacuum film forming method such as vapor deposition and sputtering, a method of forming a film by applying an ink containing a nano-particle or a precursor, and so on. The precursor is a compound which is converted into a material suitable for the anode 120 by a conversion processing after application.

<Electrode (Cathode) 160 Suitable for Collection of Electron>

The electrode (cathode) suitable for collection of the electron is generally an electrode constituted by a conductive material exhibiting a higher value of work function than the anode. Such a cathode 160 can extract the electron generated in the active layer 140 smoothly. As forming materials of the cathode 160, there can be cited, for example, a metal such as platinum, gold, silver, copper, iron, tin, zinc, aluminum, indium, chromium, lithium, sodium, potassium, cesium, calcium, magnesium, or an alloy thereof, an inorganic salt such as a lithium fluoride and a potassium fluoride, and a metal oxide such as a nickel oxide, an aluminum oxide, a lithium oxide, and a cesium oxide. These materials are materials having low work functions, and are suitable as the materials for the cathode 160.

With regard also to the cathode 160, it is possible to provide a buffer layer 150 between the cathode 160 and the active layer 140, similarly to in a case of the anode 120. For example, when an n-type semiconductor having a conductivity such as titania is used as the buffer layer 130, it is possible to use a material having a high work function as the material for the cathode 160. From a viewpoint of electrode protection, as the forming material for the cathode 160, a metal such as platinum, gold, silver, copper, iron, tin, aluminum, calcium, and indium, or an alloy thereof is preferable.

A film thickness of the cathode 160 is not limited in particular, but is preferable to be 10 nm or more to 10 μm or less and is more preferable to be 50 nm or more to 500 nm or less. If the film thickness of the cathode 160 is too thin, a sheet resistance becomes high, and if the film thickness of the anode 120 is too thick, a light transmittance is lowered. When the cathode 160 is a transparent electrode, it is preferable to select a film thickness so that both a high light transmittance and a low sheet resistance can be obtained. The sheet resistance of the cathode 160 is not limited in particular, but is preferable to be 500Ω/□ or less and is more preferable to be 200Ω/□ or less. Though not limited, a minimum value is usually 1Ω/□ or more. In view of extracting a larger current, it is preferable that the sheet resistance is small.

As forming methods of the cathode 160, there can be cited a vacuum film forming method such as vapor deposition and sputtering, a method of forming a film by applying an ink containing a nano-particle or a precursor, and so on.

<Buffer Layer (130, 150)>

The solar cell element 100 of the embodiment can have, in addition to the pair of electrodes 120, 160 and the active layer 140 disposed therebetween, one or more buffer layer(s). The buffer layers are classified into a hole extraction layer 130 and an electron extraction layer 150. Normally, the hole extraction layer 130 is disposed between the active layer 140 and the anode 120, and the electron extraction layer 150 is disposed between the active layer 140 and the cathode 160.

<Hole Extraction Layer (130)>

A material for the hole extraction layer 130 is not limited in particular as long as the material enables improvement of an efficiency of extraction of the hole from the active layer 140 to the anode 120. Concretely, there can be cited a conductive polymer made by doping at least one of doping materials of a sulfonic acid and iodine into polythiophene, polypyrrole, polyacetylene, triphenylenediaminepolypyrrol, polyaniline or the like. Among the above, the conductive polymer made by doping the sulfonic acid is preferable, and further, a PEDOT:PSS made by doping a polystyrenesulfonic acid into a polythiophene derivative is more preferable. A metal oxide semiconductor such as a tungsten oxide and a molybdenum oxide can be used. A thin film of a metal such as gold, indium, silver, and palladium can be also used as the hole extraction layer 130. The metal thin film can be used independently as the hole extraction layer 130. It is possible to combine the metal thin film and the above-described conductive polymer, to use as the hole extraction layer 130.

A film thickness of the hole extraction layer 130 is not limited in particular, but normally the film thickness thereof is 1 nm or more to 200 nm or less. The film thickness of the hole extraction layer 130 is preferable to be 5 nm or more and preferable to be 100 nm or less. If the film thickness of the hole extraction layer 130 is too thin, uniformity becomes insufficient and there is a tendency that a short circuit occurs. If the film thickness of the hole extraction layer 130 is too thick, a resistance value is increased and there is a tendency that the hole is hard to be extracted.

<Electron Extraction Layer (150)>

A material for the electron extraction layer 150 is not limited in particular as long as the material enables improvement of an efficiency of extraction of the electron from the active layer 140 to the cathode 160. The forming materials for the electron extraction layer 150 are categorized into an inorganic compound and an organic compound. The electron extraction layer 150 can be formed by using the material of only either one category of the above, or can be formed by using the materials of both categories. It is possible to use a laminated body of an inorganic compound layer and an organic compound layer as the electron extraction layer 150.

As the inorganic compound material used for the electron extraction layer 150, a salt of an alkali metal such as lithium, sodium, potassium, and cesium, and an n-type oxide semiconductor compound such as a titanium oxide ($TiO_x$) and a zinc oxide (ZnO) are preferable. As the salt of the alkali metal, a fluoride salt such as a lithium fluoride, a sodium fluoride, a potassium fluoride, and a cesium fluoride is preferable. By using such a material, when using in combination with the cathode 160 made of aluminum or the like, it is possible to make a work function of the cathode 160 small and to raise a voltage applied to the inside of the solar cell element 100.

When the alkali metal salt is used as the forming material for the electron extraction layer 150, a vacuum film forming method such as vacuum deposition and sputtering can be applied to form the electron extraction layer 150. Among the above, it is desirable to form the electron extraction layer 150 by vacuum deposition by resistance heating. Usage of vacuum deposition can make a damage to the other layers such as an active layer 140 smaller. A film thickness in such a case is preferable to be 0.1 nm or more to 50 nm or less, and is more preferable to be 20 nm or less. If the electron extraction layer 150 is too thin, an effect to improve an efficiency of extraction of an electron becomes insufficient. If the electron extraction layer 150 is too thick, there is a possibility that a property of the element is impaired by the electron extraction layer 150 acting as a series resistance component.

When the titanium oxide is used as the forming material for the electron extraction layer 150, a vacuum film forming method such as sputtering can be applied to form the electron extraction layer 150. However, it is more preferable that the electron extraction layer 150 made of the titanium oxide is formed by a coating method. For example, it is possible to form an electron extraction layer 150 constituted by a titanium oxide by a sol gel method described in Adv. Mater. 18, 572 (2006). A film thickness in that case is normally 0.1 nm or more to 100 nm or less, and is preferable to be 5 nm or more to 50 nm or less. If the electron extraction layer 150 is too thin, an effect to improve the efficiency of extraction of the electron becomes insufficient. If the electron extraction layer 150 is too thick, there is a possibility that a property of the element is impaired by the electron extraction layer 150 acting as a series resistance component.

In a case also where the zinc oxide is used as the forming material for the electron extraction layer 150, formation can be performed by using a vacuum film forming method such as sputtering, but it is preferable to form the electron extraction layer 150 by using a coating method. For example, according to a sol gel method described in Sol-Gel Science, C. J. Brinker, G. W. Scherer, Academic Press (1990), an electron extraction layer 150 constituted by a zinc oxide can be formed. A film thickness in that case is normally 0.1 nm or more to 400 nm or less, and is preferable to be 1 nm or more to 50 nm or less. If the electron extraction layer 150 is too thin, an effect to improve an efficiency of extraction of an electron becomes insufficient. If the electron extraction layer 150 is too thick, there is a possibility that a property of the element is impaired by the electron extraction layer 150 acting as a series resistance component.

As an organic compound material used as the electron extraction layer 150, there can be cited, for example, bathocuproine (BCP), batho phenanthrene (Bphen), (8-hydroxyquinolinato)aluminum (Alq3), a boron compound, an oxadiazole compound, a benzoimidazole compound, a naphthalenetetracarboxylic acid anhydride (NTCDA), a perylenetetracarboxylic acid anhydride (PTCDA), a phosphineoxide compound, a phosphinesulfide compound, etc., and a conductive polymer, but the organic compound material used as the electron extraction layer 150 is not limited thereto. It is possible to dope a metal such as an alkali metal and an alkaline earth metal into the above-described organic compound material.

When the organic compound is used as the forming material for the electron extraction layer 150, a film thickness of the electron extraction layer 150 is normally 0.5 nm or more to 500 nm or less, and is preferable to be 1 nm or more to 100 nm or less. If the electron extraction layer 150 is too thin, an effect to improve an efficiency of extraction of an electron becomes insufficient. If the electron extraction layer 150 is too thick, there is a possibility that a property of the element is impaired by the electron extraction layer 150 acting as a series resistance component. If the electron extraction layer 150 is formed by using a plurality of materials, an entire thickness of the electron extraction layer 150 is normally 0.1 nm or more to 100 nm or less, and is preferable to be 60 nm or less.

<Forming Method of Buffer Layer>

A forming method of the buffer layers 130, 150 is not limited in particular. Film forming methods for several materials are as described above. Generally, when a material having a sublimability is used, a vacuum film forming method such as vacuum deposition can be used. When a material soluble to a solvent is used, a wet coating method such as spin-coating and ink-jet can be used.

<Substrate (110)>

The solar cell element 100 normally has the substrate 100 being a supporter. The electrodes 120, 160, the active layer 140, and the buffer layers 130, 150 are formed on the substrate 100. A material for the substrate 110 is not limited in particular. As the substrate materials, there can be cited an inorganic material such as quartz, glass, sapphire, titania, an organic material such as polyethylene terephthalate, polyethylenenaphthalate, polyethersulfone, polyimide, nylon, polystyrene, a polyvinyl alcohol, an ethylene-vinyl alcohol copolymer, a fluorocarbon resin, a vinyl chloride, polyolefin such as polyethylene, cellulose, a polyvinylidene chloride, aramid, a polyphenylene sulfide, polyurethane, polycarbonate, polyarylate, polynorbornene, and an epoxy resin, a paper material such as paper and synthetic paper, a composite material made by applying or laminating a layer which gives an insulation performance to a metal such as stainless steel, titanium, aluminum, and so on. As the glass, soda glass, blue plate glass, no-alkali glass, and so on can be cited. With regard to a quality of the material of the glass, since fewer eluted ions are better, the no-alkali glass is preferable. When glass as thin as 0.3 mm or less is used, it is preferable to use a laminated body with the above-described polymer film as a substrate, in order to make the substrate hard to crack.

A shape of the substrate 110 is not limited and a shape of board, film, sheet, or the like can be used, for example. A thickness of the substrate 110 is not limited in particular, either. The thickness of the substrate 110 is normally 5 μm or more to 20 mm or less, and is preferable to be 20 μm or more to 10 mm or less. If the substrate 110 is too thin, there is a possibility that a strength of the solar cell element 100 is insufficient, and if the substrate 110 is too thick, there is a possibility that a cost becomes high or a weight becomes too heavy. In a case where the substrate 110 is of glass, excessive thinness reduces a mechanical strength and makes the substrate 110 easy to crack, and thus the thickness thereof is preferable to be 0.01 mm or more and more preferable to be 0.1 mm. Further, excessive thickness makes the substrate 110 heavy, and thus the thickness of the substrate 110 is preferable to be 10 mm or less, and is more preferable to be 3 mm or less.

<Method for Manufacturing Solar Cell Element 100>

The solar cell element 100 of the embodiment can be fabricated by sequentially forming the electrode 120, the active layer 140, and the electrode 160 on the substrate 110 by the aforementioned method. When the buffer layers 130, 150 are to be provided, the electrode 120, the buffer layer 130, the active layer 140, the buffer layer 150, and the electrode 160 are sequentially formed on the substrate 110. Further, it is preferable that a heat treatment (annealing treatment) is performed to a laminated body obtained by sequentially forming each layer on the substrate 110. By performing the annealing treatment, a heat stability, a durability, or the like of the solar cell element 100 sometimes improves. The annealing treatment sometimes improves an adhesion between each layer, which is considered to be one of the reasons for the above.

A heating temperature is normally 200° C. or less, and is preferable to be 180° C. or less, and is more preferable to be 150° C. or less. The heating temperature is normally 50° C. or more, and is preferable to be 80° C. or more. If the temperature is too low, there is a possibility that an improvement effect of the adhesion cannot be obtained sufficiently. If the temperature is too high, there is a possibility that a compound included in the active layer 140 is thermally decomposed, for example. Note that heating at a plurality of temperatures can be applied to the annealing treatment. A heating time is normally 1 minute or more to 3 hours or less, and is preferable to be 3 minutes or more to 1 hour or less. It is preferable that the annealing treatment is terminated when an open circuit voltage, a short-circuit current, and a fill factor, which are parameters for a solar cell performance, reach predetermined values. The annealing treatment is preferable to be performed under a normal pressure, and is also preferable to be performed in an inert gas atmosphere.

The solar cell of the embodiment can be fabricated by using an arbitrary method. For example, according to a known technique, a surface of an organic thin film solar cell (solar cell element 100) is covered by an appropriate protective material in order for improvement of a weather resistance, and thereby a solar cell can be fabricated. As the protective material, there can be cited a weather-resistant protective film, an ultraviolet cutting film, a gas barrier film, a getter material film, a sealant, and so on. It is possible to add a known configuration other than the above.

EXAMPLES

Next, examples and their evaluation results will be described.

Example 1

Synthesis of Poly(4,8-bis(5-(2-ethylhexyl)thienyl)benzo[1,2-b:4,5-b']dithiophene-2,6-diyl-alt-(5-octyl-2,7-dithia-5-azacyclopenta[a]pentalene-4,6-dione-1,3-diyl)) [P1]

[P1]

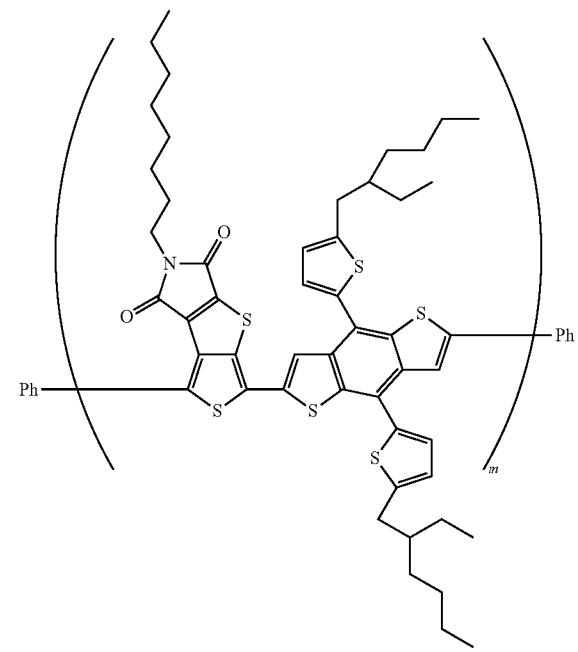

Under nitrogen weighed and fed into a three-neck flask with a three-way cock are 1.811 g (2.00 mmol) of 2,6-bis(trimethyltin)-4,8-bis(5-(2-ethylhexyl)thiophene-2-yl)benzo(1,2-b:4,5-b')dithiophene, 0.078 g (0.0675 mmol) of tetrakis(triphenylphosphine)palladium (catalyst), and 0.960 g (2.00 mmol) of 1,3-dibromo-5-octyl-2,7-dithia-5-azacyclopenta[a]pentalene-4,6-dione. While argon is made to flow into the three neck flask via the three-way cock, a reflux tube with an argon conduit is attached to the three-neck flask with argon being made to flow. Subsequently, in order to prevent deactivation of the catalyst due to interfusion of air, a dropping funnel is provided in a manner that air does not enter. The argon conduit is connected to a vacuum line, so that switching between argon and vacuum is available.

Next, the three-way cock is closed, the inside of the three-neck flask is vacuumized, and argon is introduced again. The above operation is repeated three times. From one end (argon is made to flow from another end) of the three-way cock of the three-neck flask is added 24 mL of toluene anhydride having been degassed by a syringe, and after dissolution, sucking out by a syringe is carried out. One (argon is made to flow from another) of the three-way cock of the three-neck flask is opened and a toluene solution of the compound DM in the syringe is added. Further, 8 mL of dimethylformamide (DMF) anhydride having been degassed by a syringe is weighed and added into the three-neck flask from one end (argon is made to flow from another end) of the three-way cock and the three-way cock is closed.

This three-neck flask is heated in an oil bath, made to react at a reflux temperature for 12 hours, and thereafter cooled to a room temperature. Under nitrogen, 0.161 g of trimethylphenyltin is weighed and dissolved into 4 mL of toluene anhydride having been degassed, added into the three-neck flask by a syringe similarly to the above, and heat refluxing is carried out for 2 hours. After cooling down to the room temperature, under nitrogen, 0.157 g of bromobenzene is weighed and dissolved into 4 mL of toluene anhydride having been degassed, added into the three-neck flask by a syringe similarly to the above, and heat refluxing is carried out for 2 hours. After cooling down to a room temperature, the above reaction solution is dropped into 1 L of methanol while being stirred, to precipitate a polymer. The precipitate, after being filtered by a glass filter, is dissolved into chloroform, and then the catalyst is removed through a celite column. The solvent is condensed by an evaporator, after being well stirred with methanol being added, filtration by using a glass filter is carried out to obtain a solid body. This solid body is Soxhlet extracted to refine ethyl acetate, hexane, and toluene in sequence. A toluene extract is condensed, reprecipitated by methanol, and filtered, and a solid body obtained thereby is vacuum dried at 60° C. for 4 hours, and 1.697 g (94.4%) of polymer of a black solid body is obtained.

The obtained solid body is evaluated by using an NMR device (JNM-GSX270 (brand name), produced by JEOL Ltd.). An obtained result is "1H-NMR (270 MHz, CDCl 3) δ: 8.2 to 6.3 (broad), 3.9 to 3.3 (broad), 3.3 to 2.5 (broad), 2.1 to 0.4 (m)". A peak of an aromatic proton of a benzothiophene ring and a thiophene ring of a side chain is observed at δ6.3 to 8.2 ppm, a peak corresponding to N—CH$_2$ is observed at 3.3 to 3.9 ppm, a peak corresponding to CH$_2$ bonded to the thiophene ring of the side chain is observed at 2.5 to 3.3 ppm, a peak corresponding to an alkyl group is observed at 0.5 to 2.2 ppm, each observed as a broad peak, and it is confirmed that the obtained solid body is an intended polymer.

Further, an evaluation by gel permeation chromatography is also carried out. By using a GPC device (HPCL: CBM20 (brand name) produced by SHIMAZU CORPORATION, column: K-504 produced by Shodex, solvent: chloroform), a weight-average molecular weight of polystyrene conversion is measured, and a value is $2.61 \times 10^5$ (Mw/Mn=3.95). Measurement of a UV-vis absorption spectrum (by using A2000 (brand name) produced by SHIMASU CORPORATION, and a chloroform solution is used) is carried out, and a maximum absorption peak (λmax) is 705.5 nm.

Synthesis of 1,3-dibromo-5-octyl-2,7-dithia-5-azacyclopenta[a]pentalene-4,6-dione (M6), which is used in synthesis of a polymer, is performed by a synthetic pathway (scheme 1) shown below.

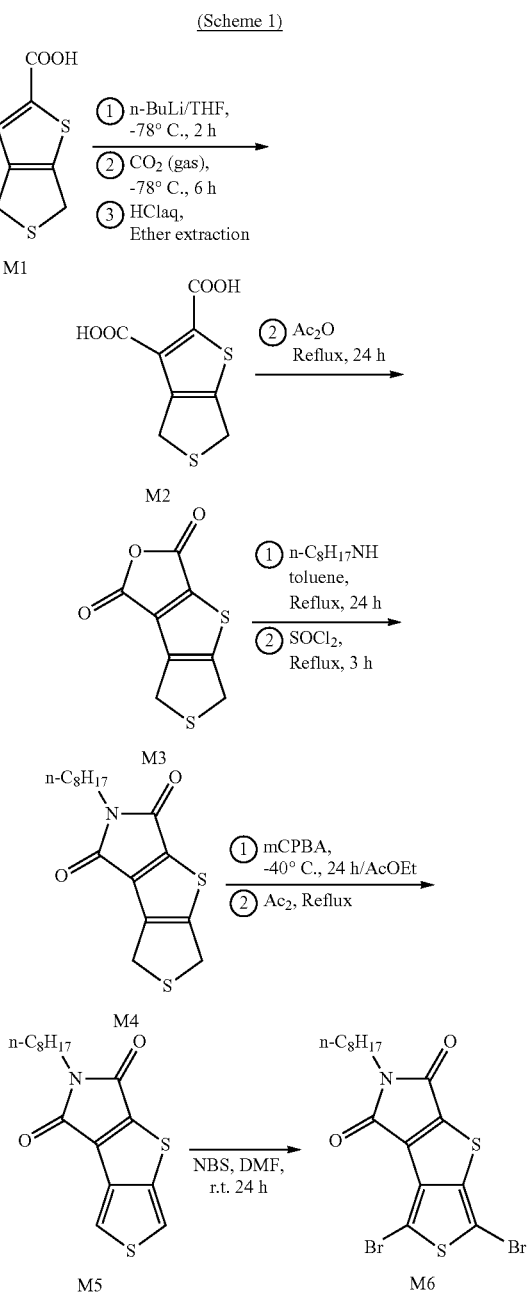

A three-neck flask is provided with a reflux cooling tube to which an argon conduit is attached and a dropping funnel. Stirring is carried out by a magnetic stirrer. To the inside of the three-neck flask, there is added 16.878 g (0.0906 mol) of 4,6-dihydrothieno[3,4-b]thiophene-2-carboxylic acid (M1), and further, 400 mL of THF anhydride is added and dissolved and cooling to −78° C. is performed by dry ice/acetone bathing. To the above, 126 mL of n-butyllithium solution of 1.6 M, kept at −70° C., is gradually dropped, while being stirred, from the dropping funnel. After dropping, stirring at −78° C. is carried out for 2 hours, and thereafter, while a carbon dioxide gas is bubbled into a solution in the flask via a gas conduit, a reaction is carried out at −78° C. for 6 hours. Thereafter, a reaction mixture is carefully poured into 1 L of diluted hydrochloric acid solution. Thereafter, three times of extractions are performed with ethyl acetate. After an organic layer is dried with a magnesium sulfate anhydride, the solvent is removed under a reduced pressure, and a yellowish brown solid body is obtained. The solid body is washed well with chloroform, to obtain 13.676 g (59.4%) of a compound (M2) of a yellow solid body.

For the obtained compound (M2), an evaluation by the NMR is carried out similarly to the above. Obtained results are "1H-NMR (270 MHz, CDCl3) δ: 4.98 (2H, s), 4.25 (2H, q, J=1.87 Hz), 4.20 (2H, dd, J=4.29, 1.6 5.0 Hz)", "13C-NMR δ: 166.9, 165.7, 148.7, 147.3, 142.7, 131.4, 35.7, 33.4".

Next, a three-neck flask is provided with a reflux cooling tube to which an argon conduit is attached and a dropping funnel, and is further furnished with a magnetic stirrer, and then 10.317 g (44.8 mmol) of the compound (M2) synthesized above is added, 120 mL of acetic anhydride is added, and heat refluxing is carried out for 24 hours. A volatile component is removed under a reduced pressure, and a blackish brown solid body is obtained. Recrystallization is performed by toluene, and 5.403 g (55.7%) of compound (M3) of a brown solid body is obtained. For the obtained compound (M3), an evaluation by the NMR is carried out similarly to the above. An obtained result is "1H-NMR (270 MHz, CDCl3) δ: 4.28 (2H, dd, J=4.12, 2.47 Hz), 74.18 (2H, q, J=2.2 Hz)".

Next, a three-neck flask is provided with a reflux cooling tube to which an argon conduit is attached and a dropping funnel, and is further furnished with a magnetic stirrer, and then 10.317 g (44.8 mmol) of the compound (M3) synthesized above is added, 50 mL of toluene anhydride is added, and thermal solution is carried out. Then, 2.650 g of n-octylamine having been dissolved in 20 mL of toluene anhydride is dropped under reflux. After dropping, a reaction is carried out at a reflux temperature for 24 hours. After a volatile component is removed under a reduced pressure, 100 mL of thionyl chloride is added, and heat refluxing is carried out under argon for 3 hours. A blackish brown material in an oil form is obtained. This material is refined through column chromatography (silica gel, hexane:toluene=2:1 to 0:1), to obtain 2.58 g (48.7%) of compound (M4) of a reddish orange solid body and 1.407 g (26.0%) of compound (M5) in a reddish orange oil form.

Evaluation results by the NMR are "1H-NMR (270 MHz, CDCl3) δ: 4.21 (2H, dd, J=2.09 Hz), 4.15 (2H, q, J=2.09 Hz), 3.57 (2H, t, J=725 Hz), 1.74 to 1.55 (m, 2H), 1.4 to 1.2 (m, 10H), 0.87 (3H, t, J=6.59 Hz)", and "13C-NMR δ: 163.7, 162.9, 152.9, 144.1, 137.7, 137.0, 38.5, 32.7, 31.8, 31.2, 29.1, 28.8, 26.8, 22.6, 14.1".

Next, a three-neck flask is provided with a reflux cooling tube to which an argon conduit is attached and a dropping funnel, and is further furnished with a magnetic stirrer, and then 2.253 g (6.91 mmol) of the compound (M4) synthesized above is added, 30 mL of chloroform is added and dissolved, and cooling to −40° C. is carried out by dry ice/acetone bathing. Further, 1.656 mL (6.91 mmol) of m-chloroperoxide benzoic acid having been dissolved in 20 mL of chloroform is gradually dropped from the dropping funnel. After a reaction at −40° C. for 30 minutes, a temperature being returned to a room temperature, a reaction for 75 minutes is further carried out. After a solvent is removed under a reduced pressure, 30 mL of acetic anhydride is added to a residue, and a reaction by heat refluxing is carried out for 20 minutes. A reaction mixture is refined through column chromatography (silica gel, hexane:toluene=1:1), to obtain 1.709 g (76.9%) of 5-octyl-2,7-dithia-5-azacyclopenta[a]pentalene-4,6-dione (M5) of an reddish orange oil form.

Evaluation results by the NMR are "1H-NMR (270 MHz, CDCl3) δ: 7.83 (1H, d, J=2.64 Hz), 7.47 (1H, t, J=2.64 Hz), 3.61 (2H, td, J=7.25 Hz), 1.56 (2H, t, J=7.09 Hz), 1.45 to 1.2 (m, 10H), 0.87 (3H, t, J=6.43 Hz)", and "13C-NMR δ: 164.3, 163.8, 149.6, 143.9, 135.9, 131.6, 116.0, 113.8, 38.5, 3.8, 39.2, 28.8, 26.8, 22.6, 14.1".

A three-neck flask of 200 mL is provided with a reflux cooling tube to which an argon conduit is attached and a dropping funnel, and is further furnished with a magnetic stirrer, and then 2.954 g (9.19 mmol) of the above-described compound (M5) is fed, 27 mL of DMF anhydride is added, and dissolving is carried out. From the dropping funnel is dropped 4.095 g (9.19 mmol) of NBS having been dissolved in 27 mL of DMF anhydride under a room temperature, and stirring is carried out for one day. A sodium thiosulfate solution is poured into a reaction mixture and extraction by ether is carried out. After an organic layer is dried by a magnesium sulfate anhydride, a solvent is removed under a reduced pressure. The above is refined through column chromatography (silica gel, hexane:toluene=1:1), to obtain 3.946 g (89.6%) of 1,3-dibromo-5-octyl-2,7-dithia-5-azacyclopenta[a]pentalene-4,6-dione (M6) of an orange solid body.

An NMR evaluation of the obtained compound (M6) is carried out. Obtained results are "1H-NMR (270 MHz, CDCl3) δ: 3.61 (2H, td, J=7.25 Hz), 1.75 to 1.55 (2H, m), 1.45 to 1.2 (m, 10H), 0.87 (3H, t, J=6.43 Hz)", and "13C-NMR δ: 163.4, 162.2, 150.5, 144.7, 136.8, 131.8, 102.4, 99.9, 38.8, 31.7, 29.14, 29.12, 28 0.7, 26.8, 22.6, 14.1".

Synthesis of 4,6-dihydrothieno[3,4-b]thiophene-2-carboxylic acid (M1) is carried out by a method described in D. J. Zwanenburg et al. J. Org. Chem., 1966, Vol. 31, 3363. The other monomer used in polymer synthesis, that is, 2,6-bis(trimethyltin)-4,8-bis(5-(2-ethylhexyl)thiophene-2-yl)benzo(1,2-b:4,5-b')dithiophene is synthesized by a method [12] described in Lijin Huo et al, Angew. Chem. Int. Ed. 2011, 50, 9697. Further, 4,6-dibromo-3-fluoro-thieno[3,4-b]thiophene-2-carboxylic acid 2-ethylhexyl is synthesized by using a method of Yongye Liang et al. described in J. Am. Chem. Soc. 2009 Vol, 131, No. 22, 7792-7799.

Example 2

Synthesis of Poly(4,8-bis(5-(2-ethylhexyl)thienyl)benzo[1,2-b:4,5-b']dithiophene-2,6-diyl-alt-(5-(4-octyl)phenyl-2,7-dithia-5-azacyclopenta[a]pentalene-4,6-dione-1,3-diyl)) [P2]

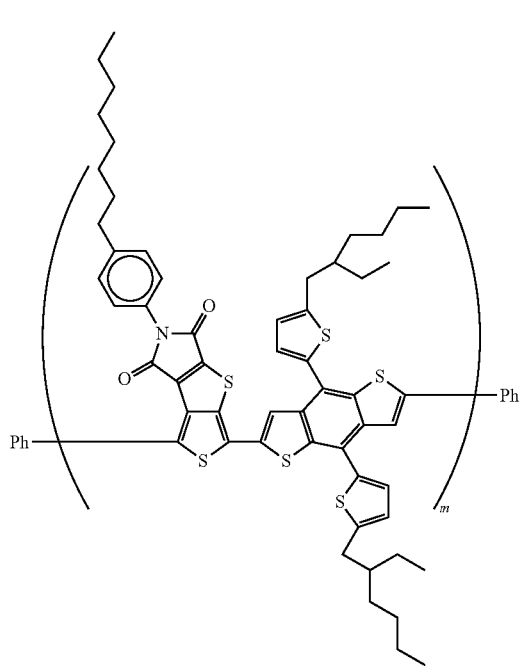

[P2]

Synthesis is carried out under a condition similar to that of the example 1, except that 1,3-dibromo-5-(4-octyl)phenyl-2,7-dithia-5-azacyclopenta[a]pentalene-4,6-dione (1H-NMR (CDCl3) δ: 7.20 (s2H9, 7.18 (s, 2H), 2.57 (2H, t, J=7.25 Hz), 1.65 to 1.45 (m, 2H), 1.35 to 1.15 (m, 10H), 0.81 (3H, t, j=6.43 Hz)) is used instead of the 1,3-dibromo-5-octyl-2,7-dithia-5-azacyclopenta[a]pentalene-4,6-dione in the example 1, and a polymer of a black solid body is obtained almost quantitavely. Soxhlet extraction is carried out to refine ethyl acetate, hexane, and toluene in sequence, and thereby a yield of 94.1% is obtained as a toluene extract.

For the obtained compound, an evaluation by the NMR is carried out. An evaluation result is "1H-NMR (270 MHz, CDCl3) δ: 8.6 to 6.2 (br), 3.3 to 2.5 (br), 2.5 to 0.5 (br)". A peak of an aromatic proton of a benzodithiophene ring and a thiophene ring of a side chain is observed at δ6.5 to 8.2 ppm, a peak corresponding to $CH_2$ bonded to the thiophene ring of the side chain and $CH_2$ bonded to a carbonyl group is observed at 2.5 to 3.3 ppm, and a peak corresponding to an alkyl group is observed at 0.5 to 2.5 ppm, each observed as a broad peak, and it is confirmed that the obtained compound is an intended polymer. Further, a weight-average molecular weight and a UV-vis absorption spectrum are measured by methods similar to those of the above, and the weight-average molecular weight of polystyrene conversion is $2.51 \times 10^5$ (Mw/Mn=4.68) and a maximum absorption peak (λmax) is 729 nm.

A monomer, that is, 1,3-dibromo-5-(2-propenyl)-2,7-dithia-5-azacyclopenta[a]pentalene-4,6-dione is synthesized by the same method as the method shown in the synthetic pathway (scheme 1), except that 4-octylphenylamine is used instead of the n-octylamine used in synthesizing the M4.

Example 3

Synthesis of Poly(4,8-bis(5-2-ethylhexyl)thienyl)benzo[1,2-b:4,5-b']dithiophene-2,6-diyl-alt-(5-(2-ethyl)hexyl-2,7-dithia-5-azacyclopenta[a]pentalene-4,6-dione-1,3-diyl)) [P3]

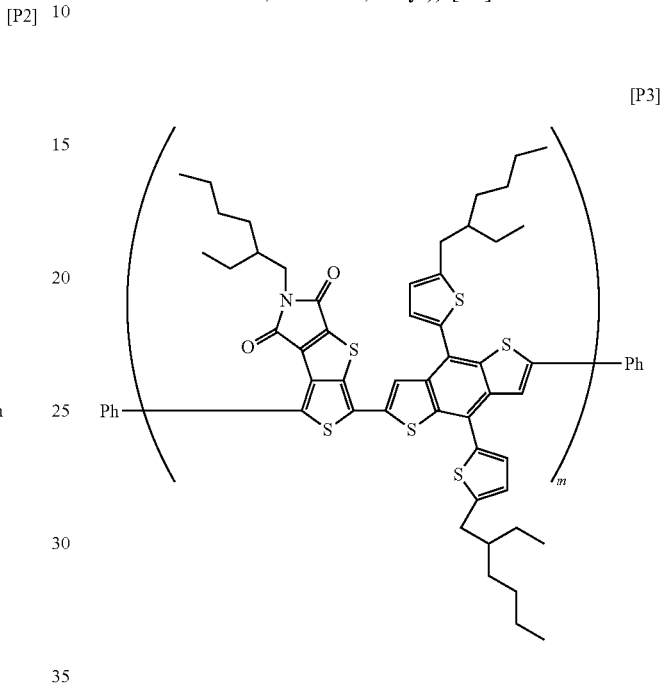

[P3]

Synthesis is carried out under a condition similar to that of the example 1, except that 1,3-dibromo-5-(2-ethylhexyl)-2,7-dithia-5-azacyclopenta[a]pentalene-4,6-dione (1H-NMR (CDCL3) δ: 3.15 (2H, d, J=7.25 Hz), 1.79 (1H, m), 1.45 to 1.15 (8H), 0.91 (3H, t), 0.89 (3H, t, 6.43) is used instead of the 1,3-dibromo-5-octyl-2,7-dithia-5-azacyclopenta[a]pentalene-4,6-dione in the example 1, and a polymer of a black solid body is obtained almost quantitavely. Soxhlet extraction is carried out to refine ethyl acetate, hexane, and toluene in sequence, and a yield of 96.7% is obtained as a toluene extract.

For the obtained compound, an evaluation by the NMR is carried out. An evaluation result is "1H-NMR (270 MHz, CDCl3) δ: 8.0 to 6.3 (broad), 3.8 to 3.3 (broad), 3.3 to 2.6 (broad), 2.3 to 0.4 (m)". A peak of an aromatic proton of a benzothiophene ring and a thiophene ring of a side chain is observed at δ6.3 to 8.0 ppm, a peak corresponding to N—$CH_2$ is observed at 3.3 to 3.8 ppm, a peak corresponding to $CH_2$ bonded to the thiophene ring of the side chain is observed at 2.3 to 3.3, and a peak corresponding to an alkyl group is observed at 0.4 to 2.3, each observed as a broad peak, and it is confirmed that the obtained compound is an intended polymer. Further, a weight-average molecular weight and an UV-vis absorption spectrum are measured by similar methods to those of the above, and the weight-average molecular weight of polystyrene conversion is $2.51 \times 10^5$ (Mw/Mn=4.68) and a maximum absorption peak (λmax) is 684.5 nm.

A monomer, that is, 1,3-dibromo-5-(2-propenyl)-2,7-dithia-5-azacyclopenta[a]pentalene-4,6-dione is synthesized by the same method as the method shown in the synthetic pathway (scheme 1), except that 2-ethylhexylamine is used instead of the n-octylamine used in synthesizing the M4.

Example 4

Synthesis of Poly(4,8-bis(5-(2-ethylhexyl)thienyl)benzo[1,2-b:4,5-b']dithiophene-2,6-diyl-alt-(5-(4-octanoyl))phenyl-2,7-dithia-5-azacyclopenta[a]pentalene-4,6-dione-1,3-diyl)) [P4]

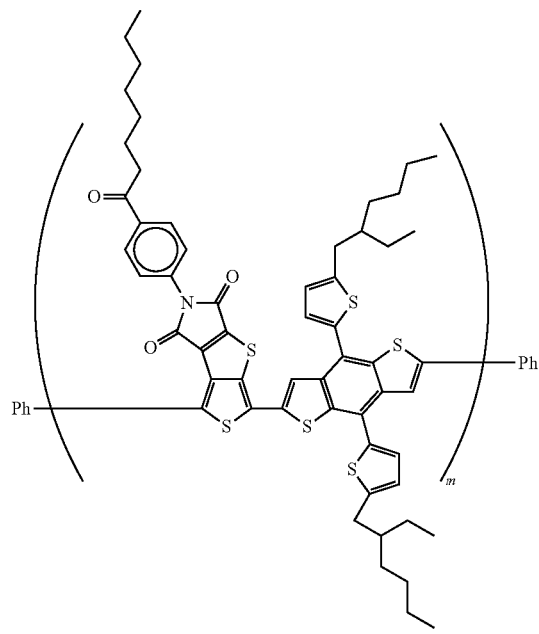

Synthesis is carried out under a condition similar to that of the example 1, except that 1,3-dibromo-5-(4-octanoylphenyl)-2,7-dithia-5-azacyclopenta[a]pentalene-4,6-dione is used instead of the 1,3-dibromo-5-octyl-2,7-dithia-5-azacyclopenta[a]pentalene-4,6-dione in the example 1, and a polymer of a black solid body is obtained almost quantitavely. Soxhlet extraction is carried out to refine ethyl acetate, hexane, toluene, and dichlorobenzene in sequence, and a yield of 83.5% is obtained as a dichlorobenzene extract.

For the obtained compound, an evaluation by the NMR is carried out. An evaluation result is "1H-NMR (270 MHz, CDCl3) δ: 8.2 to 6.5 (br), 3.3 to 2.5 (br), 2.5 to 0.5 (br)". A peak of an aromatic proton of a benzodithiophene ring and a thiophene ring of a side chain is observed at δ6.5 to 8.2 ppm, a peak corresponding to $CH_2$ bonded to the thiophene ring of the side chain and $CH_2$ bonded to a carbonyl group is observed at 2.5 to 3.3 ppm, and a peak corresponding to an alkyl group is observed at 0.5 to 2.5, each observed as a broad peak, and it is confirmed that the obtained compound is an intended polymer. Further, a weight-average molecular weight and a UV-vis absorption spectrum are measured by methods similar to those of the above, and the weight-average molecular weight of polystyrene conversion is $8.50 \times 10^4$ (Mw/Mn=3.54) and a maximum absorption peak (λmax) is 747 nm.

A monomer, that is, 1,3-dibromo-5-(4-octanoylphenyl)-2,7-dithia-5-azacyclopenta[a]pentalene-4,6-dione is synthesized by the same method as the method shown in the synthetic pathway (scheme 1), except that 4-aminooctanophenone is used instead of the n-octylamine used in synthesizing the M4.

Example 5

Synthesis of Poly(4,8-bis(5-(2-ethylhexyl)thienyl)benzo[1,2-b:4,5-b']dithiophene-2,6-diyl-alt-(5-butyl-2,7-dithia-5-azacyclopenta[a]pentalene-4,6-dione-1,3-diyl)) [P5]

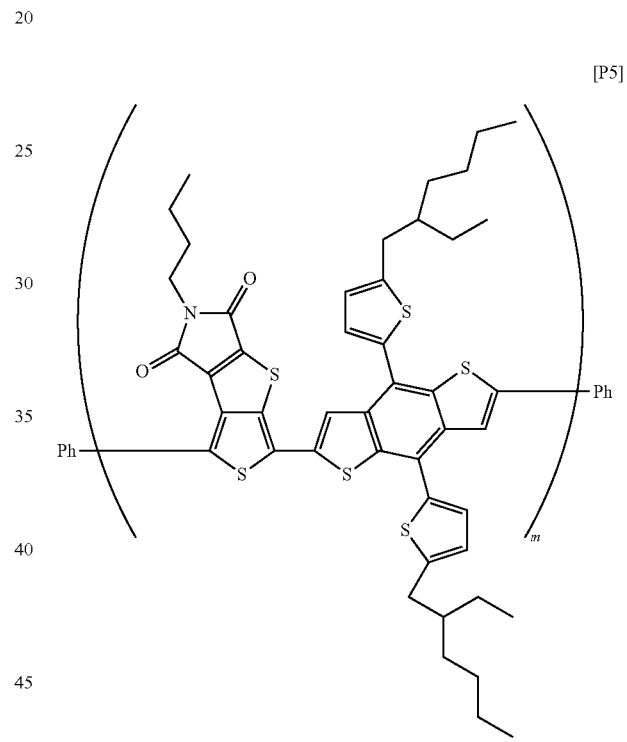

Synthesis is carried out under a condition similar to that of the example 1, except that 1,3-dibromo-5-butyl-2,7-dithia-5-azacyclopenta[a]pentalene-4,6-dione is used instead of the 1,3-dibromo-5-octyl-2,7-dithia-5-azacyclopenta[a]pentalene-4,6-dione in the example 1, and a polymer of a black solid body is obtained almost quantitavely. Soxhlet extraction is carried out to refine ethyl acetate, hexane, toluene, and chlorobenzene in sequence, and a yield of 25.1% is obtained as a toluene extract, and a yield of 57% is obtained as a chlorobenzene extract. A total yield is 82.1%.

For the obtained compound, an evaluation by the NMR is carried out. An evaluation result is "1H-NMR (270 MHz, CDCl3) δ: 8.0 to 6.3 (broad), 3.8 to 3.3 (broad), 3.3 to 2.6 (broad), 2.3 to 0.4 (m)". A peak of an aromatic proton of a benzodithiophene ring and a thiophene ring of a side chain is observed at δ6.3 to 8.1 ppm, a peak corresponding to N—$CH_2$ is observed at 3.3 to 3.8 ppm, a peak corresponding to $CH_2$ bonded to the thiophene ring of the side chain is observed at 2.3 to 3.3, and a peak corresponding to an alkyl group is observed at 0.4 to 2.3, each observed as a broad peak, and it is confirmed that the obtained compound is an intended polymer. Further, a weight-average molecular weight and a UV-vis absorption spectrum are measured by methods similar to those of the above, and the weight-average molecular weight of polystyrene conversion is $1.05×10^5$ (Mw/Mn=3.8) and a maximum absorption peak (λmax) is 719 nm.

A monomer, that is, 1,3-dibromo-5-(2-propenyl)-2,7-dithia-5-azacyclopenta[a]pentalene-4,6-dione is synthesized by the same method as the method shown in the synthetic pathway (scheme 1), except that butylamine is used instead of the n-octyl amine used in synthesizing the M4.

Example 6

Synthesis of Poly(4,8-bis(5-(2-ethylhexyl)thienyl)benzo[1,2-b:4,5-b']dithiophene-2,6-diyl-alt-(5-octyl-2,7-dithia-5-azacyclopenta[a]pentalene-4,6-dione-1,3-diyl)-alt-pyrenyl-1,6-diyl [P6]

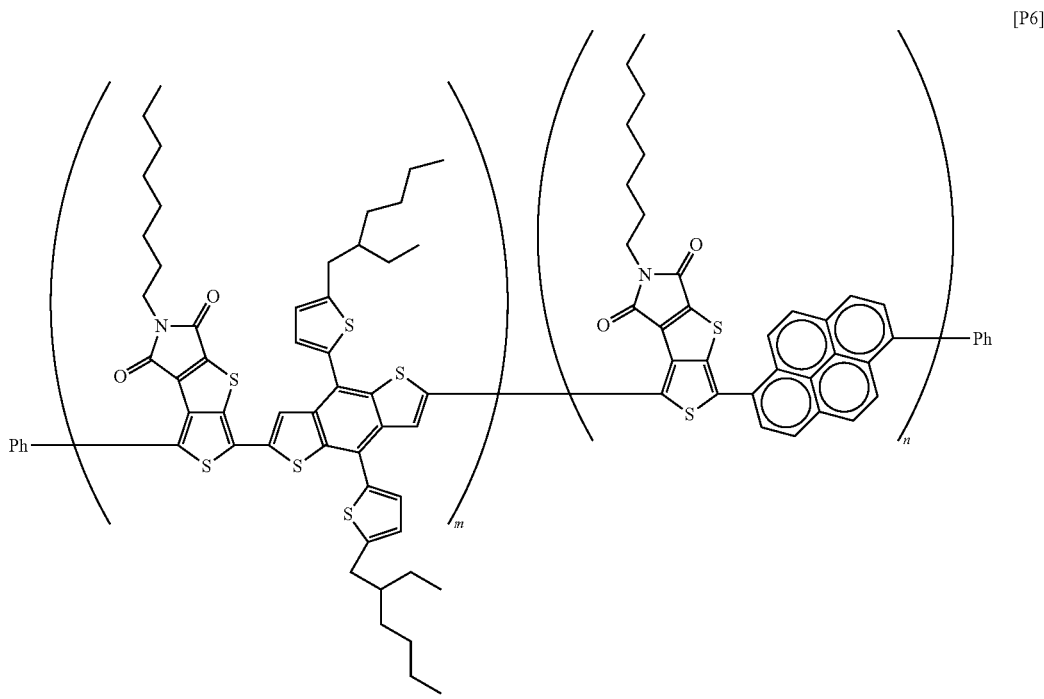

[P6]

Synthesis is carried out under a condition similar to that of the example 1, except that 1.8 mmol of 1,3-dibromo-5-octyl-2,7-dithia-5-azacyclopenta[a]pentalene-4,6-dione and 0.2 mmol of 1,6-bromopyrene are used instead of 2 mmol of the 1,3-dibromo-5-octyl-2,7-dithia-5-azacyclopenta[a]pentalene-4,6-dione in the example 1, and a polymer of a black solid body is obtained at a yield of 84%. Soxhlet extraction is carried out to refine ethyl acetate, hexane, and toluene in sequence, and a yield of 76.5% is obtained as a toluene extract.

For the obtained compound, an evaluation by the NMR is carried out. An evaluation result is "1H-NMR (270 MHz, CDCl3) δ: 8.0 to 6.3 (broad), 3.8 to 3.3 (broad), 3.3 to 2.6 (broad), 2.3 to 0.4 (m)". A peak of an aromatic proton of a pyrene ring, a benzodithiophene ring, and a thiophene ring of a side chain is observed at δ6.3 to 8.2 ppm, a peak corresponding to N—CH$_2$ is observed at 3.3 to 3.8 ppm, a peak corresponding to CH$_2$ bonded to the thiophene ring of the side chain is observed at 2.3 to 3.3, and a peak corresponding to an alkyl group is observed at 0.4 to 2.3, each observed as a broad peak, and it is confirmed that the obtained compound is an intended polymer. A weight-average molecular weight and a UV-vis absorption spectrum are measured by methods similar to those of the above, and the weight-average molecular weight of polystyrene conversion is $9.37 \times 10^4$ (Mw/Mn=4.84) and a maximum absorption peak (λmax) is 651.5 nm.

Example 7

Synthesis of Poly(4,8-bis(5-(2-ethylhexyl)thienyl)benzo[1,2-b: 4,5-b']dithiophene-2,6-diyl-alt-(5-octyl-2,7-dithia-5-azacyclopenta[a]pentalene-4,6-dione-1,3-diyl)-alt-perylenyl-1,7-diyl) [P7]

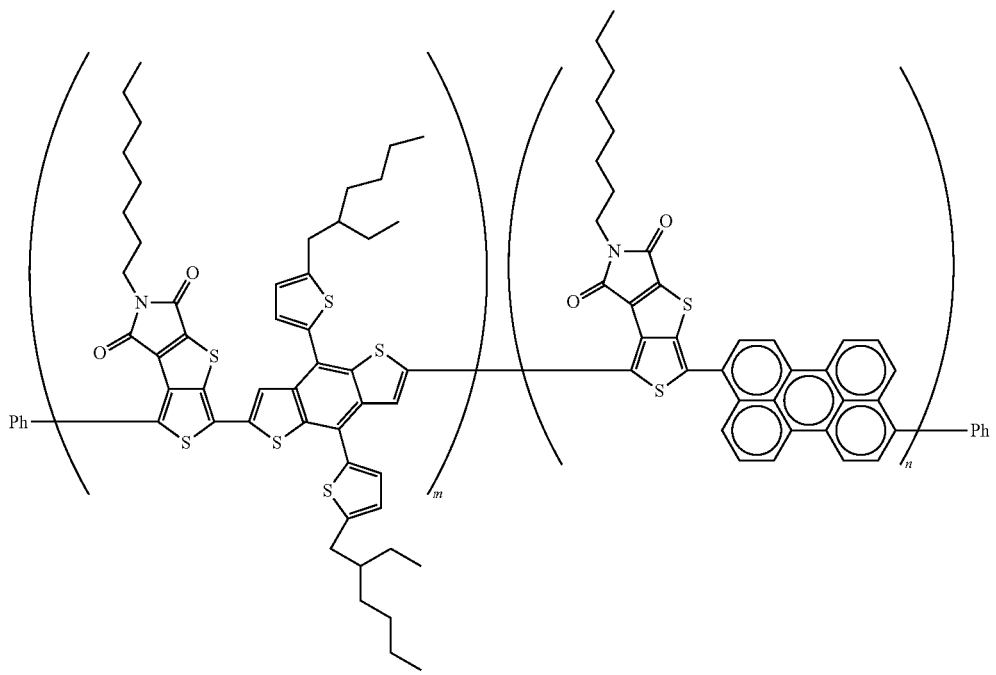

[P7]

Synthesis is carried out under a condition similar to that of the example 6, except that 1,7-perylene is used instead of the 1,6-pyrene in the example 6, and a polymer of a black solid body is obtained almost quantitavely. Soxhlet extraction is carried out to refine ethyl acetate, hexane, and toluene in sequence, and a yield of 91.1% is obtained as a toluene extract.

For the obtained compound, an evaluation by the NMR is carried out. An evaluation result is "1H-NMR (270 MHz, CDCl3) δ: 8.2 to 6.3 (broad), 3.8 to 3.3 (broad), 3.3 to 2.6 (broad), 2.3 to 0.4 (m)". A peak of an aromatic proton of a perylene ring, a benzodithiophene ring, and a thiophene ring of a side chain is observed at δ6.3 to 8.24 ppm, a peak corresponding to N—$CH_2$ is observed at 3.3 to 3.8 ppm, a peak corresponding to $CH_2$ bonded to the thiophene ring of the side chain is observed at 2.3 to 3.3, and a peak corresponding to an alkyl group is observed at 0.4 to 2.3, each observed as a broad peak, and it is confirmed that the obtained compound is an intended polymer. A weight-average molecular weight and a UV-vis absorption spectrum are measured by methods similar to those of the above, and the weight-average molecular weight of polystyrene conversion is $8.3 \times 10^4$ (Mw/Mn=2.8) and a maximum absorption peak (λmax) is 662 nm.

Example 8

Synthesis of Poly(4,8-bis(5-(2-ethylhexyl)thienyl) benzo[1,2-b: 4,5-b']dithiophene-2,6-diyl-alt-(5-(2-propenyl)-2,7-dithia-5-azacyclopenta[a]pentalene-4,6-dione-1,3-diyl [P8]

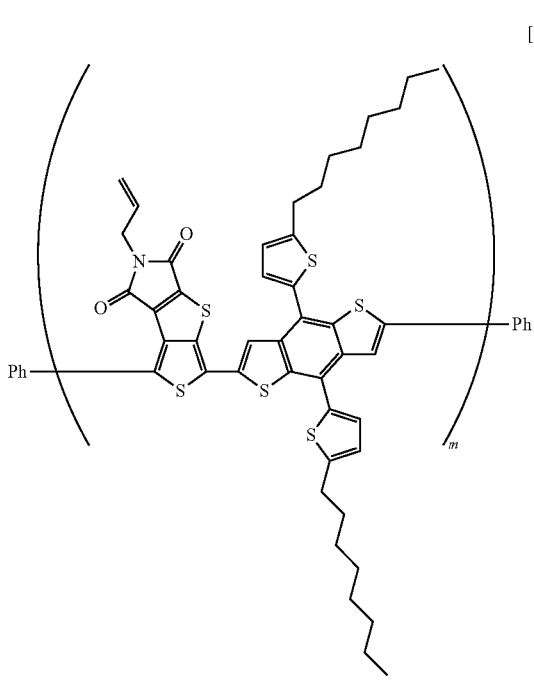

Synthesis is carried out under a condition similar to that of the example 1, except that 1,3-dibromo-5-(2-propenyl)-2,7-dithia-5-azacyclopenta[a]pentalene-4,6-dione is used instead of the 1,3-dibromo-5-octyl-2,7-dithia-5-azacyclopenta[a]pentalene-4,6-dione in the example 1, and a polymer of a black solid body is obtained almost quantitavely. Soxhlet extraction is carried out to refine ethyl acetate, hexane, toluene, and chlorobenzene in sequence, and a yield of 15% is obtained as a toluene extract, and a yield of 35.4% is obtained as a chlorobenzene extract. A total yield is 50.4%.

For the obtained compound, an evaluation by the NMR is carried out. An evaluation result is "1H-NMR (270 MHz, CDCl3) δ: 8.2 to 6.4 (broad), 5.8 to 6.2 (broad), 5.3 to 4.9 (broad), 3.7 to 3.3 (broad), 3.3 to 2.6 (broad), 2.3 to 0.4 (m)". A peak of an aromatic proton of a benzodithiophene ring and a thiophene ring of a side chain is observed at δ6.3 to 8.2 ppm, a peak corresponding to a double bond ($CH_2$=CH—) is observed at 5.8 to 6.2 ppm and 5.3 to 4.9 ppm, a peak corresponding to N—$CH_2$ is observed at 3.3 to 3.7 ppm, a peak corresponding to $CH_2$ bonded to the thiophene ring of the side chain is observed at 2.3 to 3.3, and a peak corresponding to an alkyl group is observed at 0.4 to 2.3, each observed as a broad peak, and it is confirmed that the obtained compound is an intended polymer. Further, a weight-average molecular weight and a UV-vis absorption spectrum are measured by methods similar to those of the above, and the weight-average molecular weight of polystyrene conversion is $7.6 \times 10^4$ (Mw/Mn=2.1) and a maximum absorption peak (λmax) is 681 nm.

A monomer, that is, 1,3-dibromo-5-(2-propenyl)-2,7-dithia-5-azacyclopenta[a]pentalene-4,6-dione is synthesized by the same method as the method shown in the synthetic pathway (scheme 1), except that allylamine is used instead of the n-octylamine used in synthesizing the M4.

Example 9

Synthesis of Poly(4,8-bis(5-(2-ethylhexyl)thienyl) benzo[1,2-b:4,5-b']dithiophene-2,6-diyl-alt-(5-heptyl-2,7-dithia-5-azacyclopenta[a]-pentalene-4,6-dione-1,3-diyl)) [P9]

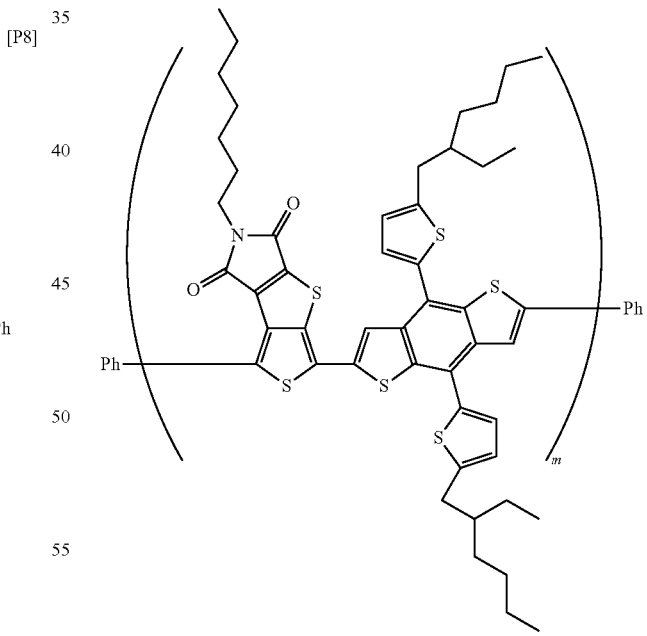

Synthesis is carried out under a condition similar to that of the example 1, except that 1,3-dibromo-5-butyl-2,7-dithia-5-azacyclopenta[a]pentalene-4,6-dione is used instead of the 1,3-dibromo-5-octyl-2,7-dithia-5-azacyclopenta[a]pentalene-4,6-dione in the example 1, and a polymer of a black solid body is obtained almost quantitavely. Soxhlet extraction is carried out to refine ethyl acetate, hexane, toluene, and chlorobenzene in sequence, and a yield of 52.5% is obtained as a toluene extract, and a yield of 37.4% is obtained as a chlorobenzene extract. A total yield is 89.9%. A weight-average molecular weight and an UV-vis absorption spectrum are measured by methods similar to those of the above, and the weight-average molecular weight of polystyrene conversion is $2.3 \times 10^5$ (Mw/Mn=3.5) and a maximum absorption peak ($\lambda$max) is 714 nm.

Example 10

Synthesis of Poly(4,8-bis(5-(2-ethylhexyl)furanyl)benzo[1,2-b: 4,5-b']dithiophene-2,6-diyl-alt-(5-heptyl-2,7-dithia-5-azacyclopenta[a]pentalene-4,6-dione-1,3-diyl)) [P10]

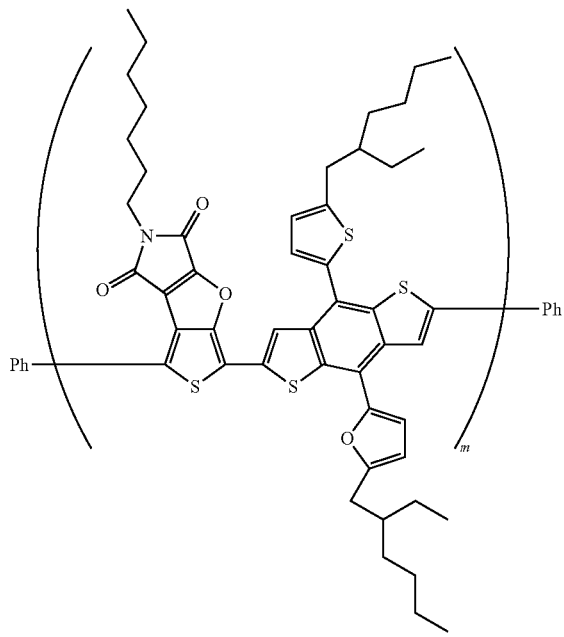

[P10]

Synthesis is carried out under a condition similar to that of the example 9, except that 2,6-bis(trimethylstannyl)-4,8-bis(5-(2-ethylhexyl)-2-furanyl)benzo[1,2-b:4,5-b']dithiophene is used instead of the 2,6-bis(trimethylstannyl)-4,8-bis((5-(2-ethylhexyl)-2-thienyl)benzo[1,2-b:4,5-b']dithiophene in the example 9, and a polymer of a black solid body is obtained almost quantitavely.

For the obtained compound, an evaluation by the NMR is carried out. An evaluation result is "1H-NMR (270 MHz, CDCl3) δ: 8.2 to 6.5 (br), 3.3 to 2.5 (br), 2.5 to 0.5 (br)". A peak of an aromatic proton of a benzodithiophene ring and a furan ring of a side chain is observed at δ6.5 to 8.2 ppm, a peak corresponding to $CH_2$ bonded to the furan ring of the side chain and $CH_2$ bonded to a carbonyl group is observed at 2.5 to 3.3 ppm, and a peak corresponding to an alkyl group is observed at 0.5 to 2.5 ppm, each observed as a broad peak, and it is confirmed that the obtained compound is an intended polymer. Further, a weight-average molecular weight and a UV-vis absorption spectrum are measured by methods similar to those of the above, and the weight-average molecular weight of polystyrene conversion is $8.7 \times 10^4$ (Mw/Mn=3.1) and a maximum absorption peak ($\lambda$max) is 690 nm.

Synthesis of the above-described 4,8-bis(2-(5-(2-ethylhexyl))-2-furanyl)benzo[1,2-b:4,5-b']dithiophene is carried out by using a method described in Angew. Chem. Int. Ed. 2011, 50, 9697. However, synthesis is carried out by using 2-ethylhexyl furan instead of 2-ethylhexyl thiophene.

Example 11

Synthesis of Poly(4,8-bis(5-(2-ethylhexyl)thienyl)benzo[1,2-b:4,5-b']dithiophene-2,6-diyl-alt-(5-octyl-2,7-dithia-5-azacyclopenta[a]pentalene-4,6-dione-1,3-diyl) whose terminal is $CF_3C_6H_4$ and $CH_3OC_6H_4$ [P11]

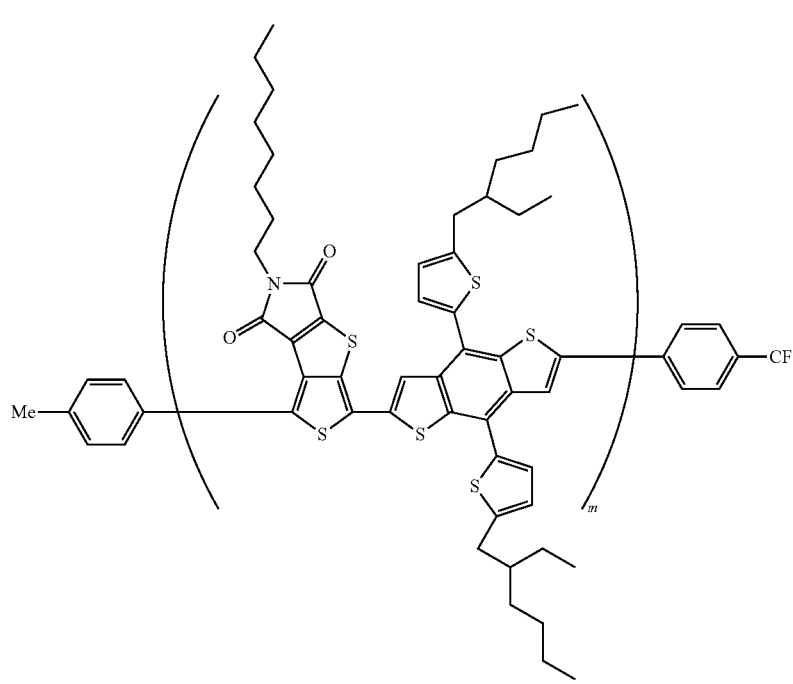

[P11]

Synthesis is carried out under a condition similar to that of the example 1, except that 4-trifluoromethylbromobenzene and 4-methoxytri-1-methylstannylbenzene are used instead of the bromobenzene and trimethylstannylbenzene as end caps of the example 1, and a polymer of a black solid body is obtained almost quantitavely. A weight-average molecular weight and a UV-vis absorption spectrum are measured by methods similar to those of the above, and the weight-average molecular weight of polystyrene conversion is $1.95 \times 10^5$ (Mw/Mn=3.8) and a maximum absorption peak ($\lambda$max) is 705 nm.

Comparative Example 1

Synthesis of Poly(4,8-bis(5-(2-ethylhexyloxy)benzo[1,2-b:4,5-b']dithiophene-2,6-diyl-alt-(5-octyl-2,7-dithia-5-azacyclopenta[a]pentalene-4,6-dione-1,3-diyl) [CP1]

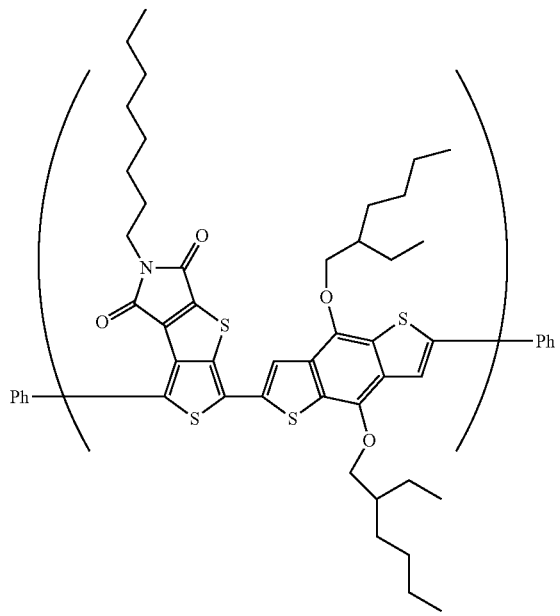

[CP1]

Synthesis is carried out under a condition similar to that of the example 1, except that 2,6-bis(trimethyl stannyl)-4,8-bis(5-(2-ethylhexyloxy)-benzo[1,2-b:4,5-b']dithiophene is used instead of the 2,6-bis(trimethylstannyl)-4,8-bis((5-(2-ethylhexyl)-thienyl)-benzo[1,2-b:4,5-b']dithiophene in the example 1, and a polymer of a black solid body is obtained almost quantitavely. Soxhlet extraction is carried out to refine ethyl acetate, hexane, and toluene in sequence and a toluene extract is obtained. A weight-average molecular weight and a UV-vis absorption spectrum are measured by methods similar to those of the above, and the weight-average molecular weight of polystyrene conversion is $1.1 \times 10^5$ (Mw/Mn=3.2) and a maximum absorption peak ($\lambda$max) is 675 nm.

Comparative Example 2

Synthesis of Poly(4,8-bis(5-(2-ethylhexyloxy)benzo[1,2-b:4,5-b']dithiophene-2,6-diyl-alt-(5-(2-ethylhexyl)-2,7-dithia-5-azacyclopenta[a]pentalene-4,6-dione-1,3-diyl) [CP2]

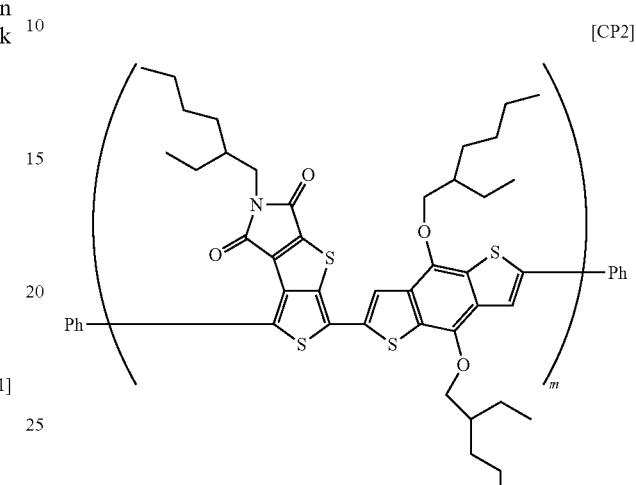

[CP2]

Synthesis is carried out under a condition similar to that of the example 3, except that 2,6-bis(trimethylstannyl)-4,8-bis(5-(2-ethylhexyloxy)benzo[1,2-b:4,5-b']dithiophene is used instead of the 2,6-bis(trimethylstannyl)-4,8-bis((5-(2-ethylhexyl)-thienyl)-benzo[1,2-b:4,5-b']dithiophene in the example 3, and a polymer of a black solid body is obtained almost quantitavely. Soxhlet extraction is carried out to refine ethyl acetate, hexane, and toluene, in sequence, to obtain a toluene extract. A weight-average molecular weight and a UV-vis absorption spectrum are measured by methods similar to those of the above, and the weight-average molecular weight of polystyrene conversion is $1.3 \times 10^5$ (Mw/Mn=2.9) and a maximum absorption peak ($\lambda$max) is 675 nm.

Comparative Example 3, 4

There is carried out, by a known method, synthesis of poly(4,8-bis(2-ethylhexyloxy)benzo[1,2-b:4,5-b']dithiophene-2,6-diyl-alt-4-(2-ethylhexyloxycarbonyl)-5-fluoro-thieno[3,4-b]thiophene-2,6-diyl) (PTB-7) and poly(4,8-bis(2-ethylhexyloxy)benzo[1,2-b:4,5-b']dithiophene-2,6-diyl-alt-4-(3-peptylcarbonyl)-thieno[3,4-b]thiophene-2,6-diyl) (PBDTTT-CT)

Examples 12 to 22, Comparative Examples 5 to 8

Fabrication of Solar Cell Element

Polymers (P1 to P11) of the examples 1 to 11 and polymers of the comparative examples 1 to 4 being p-type semiconductor materials are mixed with PC70BM being an n-type semiconductor material in a manner that a mass ratio with PC70BM becomes 1:1.5. Dissolution into chlorobenzene is carried out under a nitrogen atmosphere in a manner that a concentration of a mixture becomes 2.0 mass %.

Addition of 1,8-diiodooctane is carried out in a manner to have a ratio of 3 wt % in an entire solution, and the solution is stir-mixed at a temperature of 120° C. for 1 hour by using a hot stirrer. The solution after stir-mixing is cooled to a room temperature, and thereafter filtered by a polytetrafluoroethylene (PTFE) filter of 0.20 μm, so that active layer coating solutions of respective polymers are obtained.

After a glass substrate on which a transparent conduction film of an indium tin oxide (ITO) is patterned is washed by ultrasonic cleaning with a surface active agent, water washing with ultrapure water, and ultrasonic cleaning with ultrapure water, in sequence, the glass substrate is dried by nitrogen blowing, and then dried by heating at 120° C. for 5 minutes in the atmosphere. Lastly, ultraviolet ozone cleaning is performed to the substrate. On this substrate, there is applied, as a hole extraction layer, a poly(3,4-ethylenedioxythiophene)poly(styrenesulfonic acid) aqueous dispersion liquid (PH500 (brand name) produced by Heraeus Holding GmbH) by spin coating, and the substrate after application is heated on a hot plate of 140° C. for 5 minute in the atmosphere. A film thickness of the hole extraction layer is about 40 nm.

The active layer coating solutions of the examples 1 to 6 and 9 to 11 and the comparative examples 1 to 4 are each applied by spin coating at a speed of 600 rpm under a nitrogen atmosphere on the substrate on which the hole extraction layer has been formed, and thereby an active layer of about 90 nm in thickness is formed. Thereafter, a lithium fluoride of 0.1 nm in average film thickness as an electron extraction layer and aluminum of 100 nm in thickness as an electrode layer are sequentially formed by a resistance heating vacuum deposition method. A solar cell element of 1 cm square is fabricated as described above. The active layer coating solutions of the examples 7 and 8 are applied on the hole extraction layer, and thereafter subjected to photocross linking by irradiation of UV light (254 nm, 1.9 mW/cm$^2$) for 30 minutes under an argon atmosphere. With regard to the other processings, processings similar to those of the other examples are performed, and a solar cell element of 1 cm square is fabricated.

<Evaluation of Solar Cell Element>

A metal mask of 1 cm square is attached to a fabricated solar cell element and a current-voltage characteristic between an ITO electrode and an aluminum electrode is measured by using SPECTR solar simulator IVP0605 (brand name) with an air mass (AM) of 1.5 G and an irradiance of 100 mW/cm$^2$ produced by Asahi Spectra Co., Ltd. as an irradiation light source. Table 1 shows a measured result (open circuit voltage (Voc), short-circuit current density (Jsc), filter factor (FF), conversion efficiency).

TABLE 1

| | | Evaluation result of characteristic of organic thin film solar cell | | | |
|---|---|---|---|---|---|
| | Polymer | open circuit voltage (Voc) [V] | short-circuit current density (Jsc) [mA/cm2] | fill factor (FF) | conversion efficiency [%] |
| Example 12 | Example 1 [P1] | 0.88 | 13.3 | 0.61 | 7.11 |
| Example 13 | Example 2 [P2] | 0.87 | 11.7 | 0.62 | 6.30 |
| Example 14 | Example 3 [P3] | 0.93 | 11.0 | 0.55 | 5.65 |
| Example 15 | Example 4 [P4] | 0.91 | 13.0 | 0.68 | 6.86 |
| Example 16 | Example 5 [P5] | 0.89 | 13.5 | 0.57 | 6.97 |
| Example 17 | Example 6 [P6] | 0.92 | 11.7 | 0.55 | 5.89 |

TABLE 1-continued

| | | Evaluation result of characteristic of organic thin film solar cell | | | |
|---|---|---|---|---|---|
| | Polymer | open circuit voltage (Voc) [V] | short-circuit current density (Jsc) [mA/cm2] | fill factor (FF) | conversion efficiency [%] |
| Example 18 | Example 7 [P7] | 0.93 | 12.3 | 0.60 | 6.86 |
| Example 19 | Example 8 [P8] | 0.87 | 11.2 | 0.59 | 5.74 |
| Example 20 | Example 9 [P9] | 0.89 | 13.7 | 0.58 | 6.99 |
| Example 21 | Example 10 [P10] | 0.88 | 13.5 | 0.57 | 6.77 |
| Example 22 | Example 11 [P11] | 0.90 | 13.1 | 0.60 | 7.19 |
| Comparative Example 5 | Comparative Example 1 [CP1] | 0.70 | 10.1 | 0.61 | 4.31 |
| Comparative Example 6 | Comparative Example 2 [CP2] | 0.72 | 13.0 | 0.53 | 4.96 |
| Comparative Example 7 | Comparative Example 3 [PTB-7] | 0.72 | 12.9 | 0.71 | 6.58 |
| Comparative Example 8 | Comparative Example 4 [PBDTTT-CT] | 0.72 | 10.3 | 0.61 | 4.52 |

As is obvious from Table 1, it is known that the solar cell element using the polymer of the example has an open circuit voltage (Voc) higher than that of the comparative example by 0.15 V or more, and further, is superior in conversion efficiency (power generation efficiency). Therefore, by using the polymer of the example, it becomes possible to provide a high-performance organic thin film solar cell.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and sprit of the inventions.

What is claimed is:

1. A polymer comprising:
a repeating unit represented by the following formula (1),

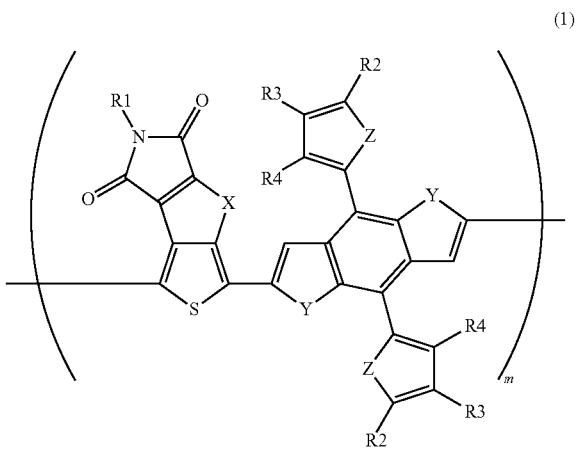

(1)

wherein R1 indicates a monovalent group selected from the group consisting of hydrogen, a substituted or unsubstituted alkyl group, a substituted or unsubstituted aromatic group, and a substituted or unsubstituted hetero-aromatic group, R2, R3, and R4 each independently indicate a monovalent group selected from the group consisting of hydrogen, halogen, a substituted or unsubstituted alkyl group, a substituted or unsubstituted alkoxy group, a substituted or unsubstituted aromatic group, and a substituted or unsubstituted hetero-aromatic group, and X, Y, and Z each independently indicate an atom selected from the group consisting of oxygen, sulfur, and selenium, and wherein a weight-average molecular weight of the polymer is in a range of 3000 or more to 1000000 or less.

2. The polymer of claim 1,
wherein a rate of the repeating unit represented by the formula (1) in relation to a total number of moles of all repeating units in the polymer is 50 mol % or more.

3. The polymer of claim 1,
wherein at least one of the R2 group, the R3 group, and the R4 group is a cross-linking group.

4. The polymer of claim 1, comprising:
a structure represented by the following formula (2),

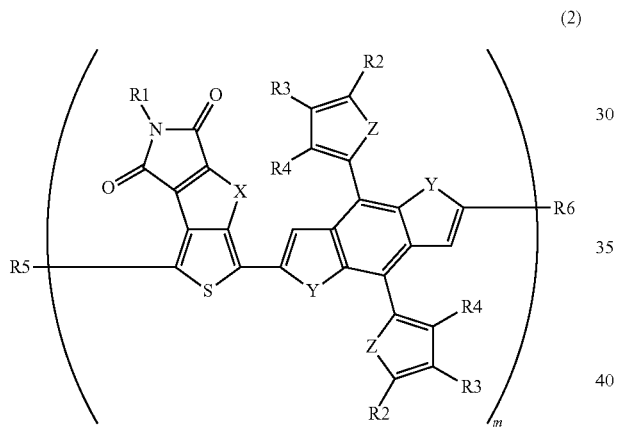

(2)

wherein R1 indicates a monovalent group selected from the group consisting of hydrogen, a substituted or unsubstituted alkyl group, a substituted or unsubstituted aromatic group, and a substituted or unsubstituted hetero-aromatic group, and R2, R3, R4, R5, and R6 each independently indicate a monovalent group selected from the group consisting of hydrogen, halogen, a substituted or unsubstituted alkyl group, a substituted or unsubstituted alkoxy group, a substituted or unsubstituted aromatic group, and a substituted or unsubstituted hetero-aromatic group, and X, Y, and Z each independently indicate an atom selected from the group consisting of oxygen, sulfur, and selenium.

5. The polymer of claim 4, qwherein at least one of the R2 group, the R3 group, and the R4 group is a cross-linking group.

6. The polymer of claim 4,
wherein at least one of the R5 group and the R6 group is an aromatic group having an electron withdrawing group or an electron releasing group.

7. The polymer of claim 4,
wherein at least one of the R5 group and the R6 group is a cross-linking group.

8. The polymer of claim 1, comprising:
a structure represented by the following formula (3), (3)

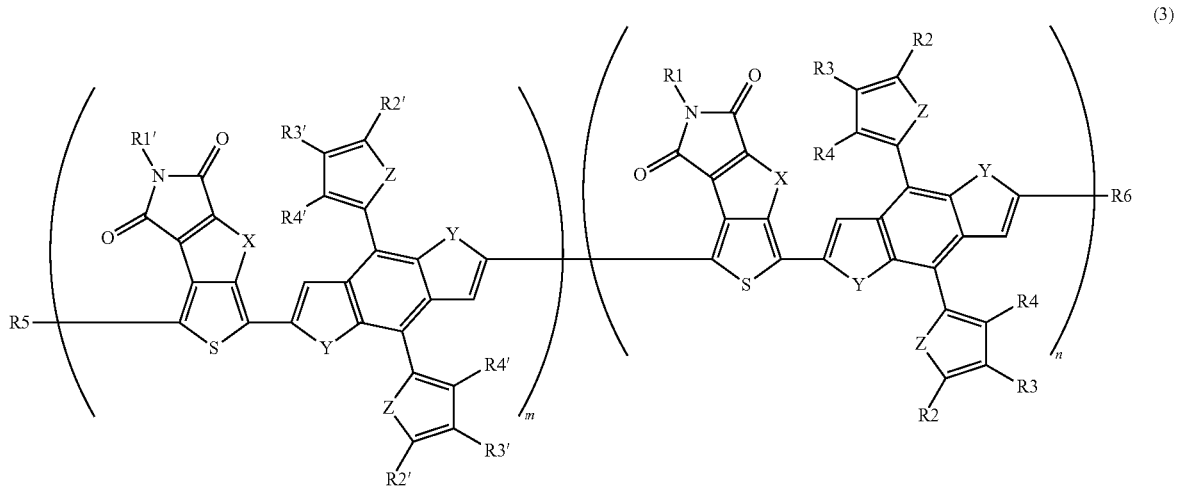

wherein R1 and R1' each independently indicate a monovalent group selected from the group consisting of hydrogen, a substituted or unsubstituted alkyl group, a substituted or unsubstituted aromatic group, and a substituted or unsubstituted hetero-aromatic group, and R2, R3, R4, R2', R3', R4', R5, and R6 each independently indicate a monovalent group selected from the group consisting of hydrogen, halogen, a substituted or unsubstituted alkyl group, a substituted or unsubstituted alkoxy group, a substituted or unsubstituted aromatic group, and a substituted or unsubstituted hetero-aromatic group, and X, Y, and Z each independently indicate an atom selected from the group consisting of oxygen, sulfur, and selenium, and wherein at least one of the R2' group, the R3' group, and the R4' group is a cross-linking group.

9. The polymer of claim 1, comprising:
a structure represented by the following formula (4), group, a substituted or unsubstituted aromatic group, and a substituted or unsubstituted hetero-aromatic group, A indicates a divalent group selected from the group consisting of a substituted or unsubstituted aromatic group and a substituted or unsubstituted hetero-aromatic group, and X, Y, and Z each independently indicate an atom selected from the group consisting of oxygen, sulfur, and selenium, and wherein a value of n/(n+m) is 0.01 or more to 0.5 or less.

10. A solar cell comprising the polymer of claim 1.

11. A solar cell, comprising:
a first electrode;
a second electrode; and
an active layer, disposed between the first electrode and the second electrode, having an electron donor and an electron acceptor,
wherein the electron donor in the active layer comprises the polymer according to claim 1.

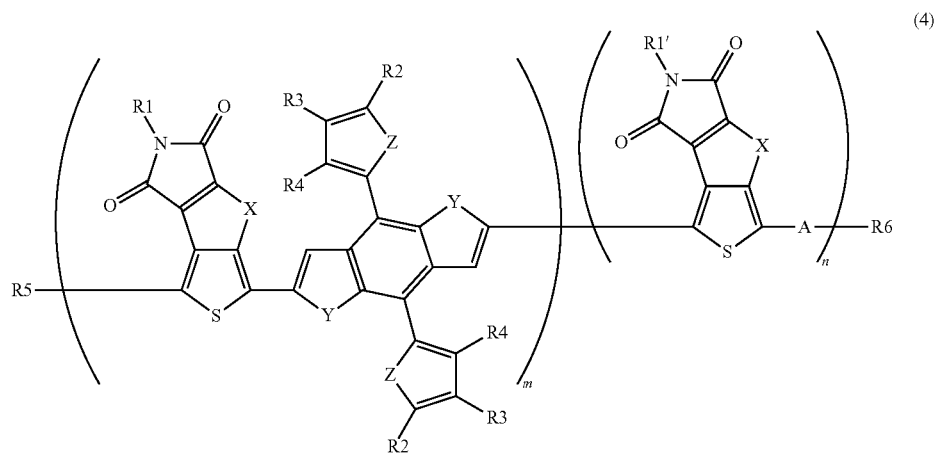

(4)

wherein R1 and R1' each independently indicate a monovalent group selected from the group consisting of hydrogen, a substituted or unsubstituted alkyl group, a substituted or unsubstituted aromatic group, and a substituted or unsubstituted hetero-aromatic group, and R2, R3, R4, R5, and R6 each independently indicate a monovalent group selected from the group consisting of hydrogen, halogen, a substituted or unsubstituted alkyl group, a substituted or unsubstituted alkoxy 12. The solar cell of claim 11,
wherein the active layer has a bulk hetero junction structure.

13. The solar cell of claim 11,
wherein the electron acceptor in the active layer comprises a fullerene or a fullerene derivative.

* * * * *